United States Patent
Oh et al.

(10) Patent No.: US 12,066,469 B2
(45) Date of Patent: Aug. 20, 2024

(54) METHOD FOR DIAGNOSING FAILURE OF POWER INPUT CIRCUIT AND SYSTEM THEREFOR

(71) Applicant: LG INNOTEK CO., LTD., Seoul (KR)

(72) Inventors: Dae Geun Oh, Seoul (KR); Beom Jun Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 248 days.

(21) Appl. No.: 17/783,061

(22) PCT Filed: Nov. 25, 2020

(86) PCT No.: PCT/KR2020/016781
§ 371 (c)(1),
(2) Date: Jun. 7, 2022

(87) PCT Pub. No.: WO2021/118112
PCT Pub. Date: Jun. 17, 2021

(65) Prior Publication Data
US 2023/0029118 A1    Jan. 26, 2023

(30) Foreign Application Priority Data

Dec. 11, 2019  (KR) .......................... 10-2019-0164900
Jan. 2, 2020   (KR) .......................... 10-2020-0000170

(51) Int. Cl.
*G01R 19/165* (2006.01)
*H02P 29/028* (2016.01)

(52) U.S. Cl.
CPC ...... *G01R 19/16571* (2013.01); *H02P 29/028* (2013.01)

(58) Field of Classification Search
CPC .................. H02P 29/028; G01R 19/16571
(Continued)

(56) References Cited

U.S. PATENT DOCUMENTS

2012/0092896 A1* 4/2012 Hachiya ............... B60L 53/22
                                                     363/16
2017/0110987 A1* 4/2017 Ghosh .................. H02M 1/12

FOREIGN PATENT DOCUMENTS

JP    2001-143890 A    5/2001
JP    2007-97368 A     4/2007
(Continued)

OTHER PUBLICATIONS

Akita et al. (WO 2017013991 A1) "Power Supply Unit and Method for Backfeed Protection Thereof" Date Published Jan. 26, 2017 (Year: 2017).*

*Primary Examiner* — Jorge L Carrasquillo
(74) *Attorney, Agent, or Firm* — Birch, Stewart, Kolasch & Birch, LLP

(57) ABSTRACT

A current measurement apparatus for a three-phase inverter, according to one embodiment of the present invention, comprises: a current detection element connected to a lower end of one of three lower switches constituting the inverter; a current measurement unit measuring currents by using the current detection element and the two lower switches that are not connected to the current detection element; and a current correction unit for correcting, on the basis of the relationship between a first current value measured by means of the current detection element and second and third current values measured by means of the two lower switches, the second and third current values.

20 Claims, 17 Drawing Sheets

(58) Field of Classification Search
USPC .......................................................... 318/434
See application file for complete search history.

(56) References Cited

FOREIGN PATENT DOCUMENTS

| | | | |
|---|---|---|---|
| JP | 2012-90406 | A | 5/2012 |
| JP | 2015-220840 | A | 12/2015 |
| KR | 10-1759739 | B1 | 7/2017 |

* cited by examiner

METHOD FOR DIAGNOSING FAILURE OF POWER INPUT CIRCUIT AND SYSTEM THEREFOR

CROSS REFERENCE TO RELATED APPLICATIONS

This application is the National Phase of PCT/KR2020/016781 filed on Nov. 25, 2020, which claims priority under 35 U.S.C. § 119(a) to Patent Application Nos. 10-2019-0164900 and 10-2020-0000170 filed in the Republic of Korea on Dec. 11, 2019 and Jan. 2, 2020, respectively, all of which are hereby expressly incorporated by reference into the present application.

TECHNICAL FIELD

The present invention relates to a method for diagnosing a failure of a power input circuit, and more particularly, relates to a method for diagnosing a failure of a power input circuit using a plurality of voltage sensing points and a system therefor, a motor driving device for driving a motor using ignition power in an emergency, and an emergency motor braking method.

BACKGROUND ART

The necessary power to an electronic control unit (ECU) inside a vehicle is provided by using the power of a battery installed therein. In general, an electronic control unit (ECU) is an electronic control device that variously controls an internal operation of a vehicle, and includes an MCU, a PMIC, a gate driver IC, and the like. The ECU operates by receiving power from the battery while the engine is turned ON through ignition (IGN).

The ECU controls various devices of the vehicle, and controls devices essential for safety. Precise control is important for safety, and for this, stable power must be provided to the ECU. In addition, since the magnitude of the voltage required for the ECU is generally smaller than that of the battery power, the battery power must be reduced to the magnitude of the voltage required for the ECU.

Battery power may be unstably inputted for various reasons, which may cause damage to the ECU. For the protection of the ECU, it is necessary to monitor the battery power. If a failure occurs in the power applied to the ECU, it is difficult to determine whether the cause of the failure is in the battery power or in the ECU's internal circuit. Accordingly, there is a problem that it is difficult to respond to a failure.

In addition, when power is cut off from the battery due to an external factor or an internal factor of an ECU, the inside of the ECU such as a PMIC and a gate driver is suddenly shut down, and when the motor is being driven, it is impossible to brake the motor, so it is impossible to stably brake the motor. In addition, there is a problem in that information on the fault condition cannot be transmitted to a higher level controller.

DETAILED DESCRIPTION OF THE INVENTION

Technical Subject

The technical problem to be solved by the present invention is to provide a failure diagnosis method and system for diagnosing a failure of a power input circuit using a plurality of voltage sensing points.

Another technical problem to be solved by the present invention is to provide a motor driving device and a motor emergency braking method for driving a motor using an ignition power source in an emergency.

The problems of the present invention are not limited to the problems mentioned above, and other problems not mentioned will be clearly understood by those skilled in the art from the following description.

Technical Solution

In order to solve the technical problems, a method for determining a failure of a power input circuit according to an embodiment of the first embodiment of the present invention comprises the steps of measuring a first voltage at a rear stage of a power input unit, a second voltage at a rear stage of the power input circuit, and a first current flowing between a terminal measuring the first voltage and a terminal measuring the second voltage; deriving a voltage drop between a terminal measuring the first voltage and a terminal measuring the second voltage using the measured first current; and determining whether a failure occurs and a failure location by using the first voltage, the voltage drop, and the second voltage.

In addition, when it is determined that a failure has occurred, it may include the step of blocking the power input of the power input unit.

In addition, the step of determining whether the failure occurs and the location of the failure may include the steps of: determining whether the first voltage is normal; comparing the second voltage with a third voltage obtained by subtracting the voltage drop from the first voltage when the first voltage is normal; and determining whether the failure has occurred and the location of the failure by using the difference between the third voltage and the second voltage.

In addition, when the first voltage is not normal, or when a difference between the third voltage and the second voltage is equal to or greater than a threshold value, it may be determined that a failure has occurred.

In addition, when the first voltage is not normal, it is determined that a failure has occurred in the preceding stage of the terminal measuring the first voltage, and the first voltage is normal and when the difference between the third voltage and the second voltage is equal to or greater than a threshold value, it may be determined that a failure has occurred in a circuit between a terminal measuring the first voltage and a terminal measuring the second voltage.

In addition, in the step of measuring the first current, the first current can be measured at a rear stage of a terminal measuring the second voltage.

In addition, in the step of measuring the first current, the first current can be measured at a MOSFET positioned between a terminal measuring the first voltage and a terminal measuring the second voltage.

In addition, in the step of deriving the voltage drop, the voltage drop may be derived from a lookup table in which the relationship between the first current and the voltage drop according to the first current is stored.

In order to solve the technical problems, in the failure of a power input circuit determination system comprising a power input unit, the failure of a power input circuit determination system according to another embodiment of the first embodiment of the present invention comprises: a first voltage measurement unit measuring a first voltage of a rear stage of the power input unit; a second voltage measurement unit measuring a second voltage of the rear stage of the power input circuit; a first current measurement unit measuring a first current flowing between a terminal measuring the first voltage and a terminal measuring the second voltage; and a processing unit deriving a voltage drop between a terminal measuring the first voltage and a terminal measuring the second voltage using the first current being measured, and determining whether or not a failure occurs and a failure location using the first voltage, the voltage drop, and the second voltage.

In addition, the processing unit may block power input of the power input unit when it is determined that a failure has occurred.

In addition, the processing unit determines whether the first voltage is normal, compares the second voltage with a third voltage obtained by subtracting the voltage drop from the first voltage when the first voltage is normal, and may determine whether the failure occurs and the location of the failure by using the difference between the third voltage and the second voltage.

In addition, the processing unit may determine that failure has occurred when the first voltage is not normal or when a difference between the third voltage and the second voltage is equal to or greater than a threshold value.

In addition, when the first voltage is not normal, the processing unit determines that a failure has occurred in the preceding stage of the terminal measuring the first voltage, and when the first voltage is normal and the difference between the third voltage and the second voltage is equal to or greater than a threshold value, it may be determined that a failure has occurred in a circuit between the terminal measuring the first voltage and the terminal measuring the second voltage.

In addition, the first current measurement unit may measure the first current at a rear stage of the power input circuit.

In addition, the power input circuit may include a reverse connection preventing unit, and the first current measurement unit may measure the first current in the reverse connection preventing unit.

In addition, it may include a storage unit storing a lookup table storing a relationship between the first current and voltage drop according to the first current.

In order to solve the other technical problems, a motor driving device according to an embodiment of the second embodiment of the present invention is characterized by comprising: a power supply unit that receives battery power or ignition power and supplies power to a control unit; and a gate driver receiving the battery power or the ignition power to operate a switch of a motor driving unit, wherein the control unit receives power from the power supply unit and controls the gate driver, wherein the motor driving unit drives the motor by receiving the battery power, and wherein the power supply unit and the gate driver receive the ignition power when an abnormality occurs in the supply of the battery power.

In addition, the battery power supply line and the ignition power supply line may be connected so as to be connected to the power supply unit and the gate driver.

In addition, the control unit may control the gate driver so that the motor driving unit operates in a motor braking mode when an abnormality occurs in the supply of the battery power.

In addition, when an abnormality occurs in the supply of battery power, the control unit may control the gate driver to form a short circuit in an upper switch or a lower switch forming the motor driving unit.

In addition, when an abnormality occurs in the supply of battery power, the control unit may pull-up an upper switch forming the motor driving unit to a first voltage and turn off the lower switch.

In addition, the control unit may pull-down a lower switch forming the motor driving unit to a ground voltage and turn off an upper switch when an abnormality occurs in the supply of the battery power.

In addition, the control unit may control the pulse width modulation signal output from the gate driver when an abnormality occurs in the supply of the battery power.

In addition, the control unit may transmit an alarm to a higher level controller or a vehicle system when an abnormality occurs in the supply of the battery power.

In addition, the motor driving unit may be formed of three upper switches and three lower switches, and the upper switch and the lower switch may be complementarily conducted to each other.

In addition, it may include a battery power detection unit for detecting the battery power.

In addition, the power supply unit and the gate driver may receive the ignition power for a predetermined time when an abnormality occurs in the supply of the battery power.

In addition, it may include a diode connecting the ignition power, the power supply unit, and the gate driver.

In addition, the motor driving device may drive a motor that operates a gear of the vehicle.

In order to solve the above other technical problems, a motor emergency braking method according to another embodiment of the second embodiment of the present invention comprises the steps of: detecting whether the supply of battery power is abnormal; operating by being supplied with ignition power when an abnormality occurs in the supply of the battery power; controlling, by the control unit, the gate driver so that a plurality of switches forming the motor driving unit operate in a motor braking mode; operating, by the gate driver, a switch of the motor driving unit in a motor braking mode; and braking the motor as a short circuit is formed in the upper switch or lower switch of the motor driving unit.

In addition, in the step of controlling the gate driver may control a pulse width modulation signal being outputted from the gate driver.

In addition, the step of operating a switch of the motor driving unit in a motor braking mode may pull-up the upper switch forming the motor driving unit to a first voltage and turn off the lower switch, or may pull-down the lower switch to a ground voltage and turn off the upper switch when an abnormality occurs in the supply of battery power.

In addition, it may include a step of transmitting information that an abnormality has occurred in the supply of the battery power to a higher level controller or a vehicle system.

Advantageous Effects

According to embodiments of the present invention, the coverage of failure diagnosis is increased by adding voltage sensing points. In addition, in order to increase the function of failure diagnosis, material cost can be reduced compared to increasing the number of pins of the connector, and the circuit implementation is simple.

In addition, in a situation where the battery power supply is blocked, it is possible to determine a failure and provide a stable emergency braking. In addition, the corresponding information can be transmitted to a higher level controller or vehicle system.

The effect according to the present invention is not limited by the contents exemplified above, and more various effects are included in the present specification.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or arranged in "on (above)" or "below (under)" of each component, "on (above)" or "below (under)" means that it includes not only the case where the two components are directly in contact with, but also the case where one or more other components are formed or arranged between the two components. In addition, when expressed as "on (above)" or "below (under)", the meaning of not only an upward direction but also a downward direction based on one component may be included.

Figure 1:
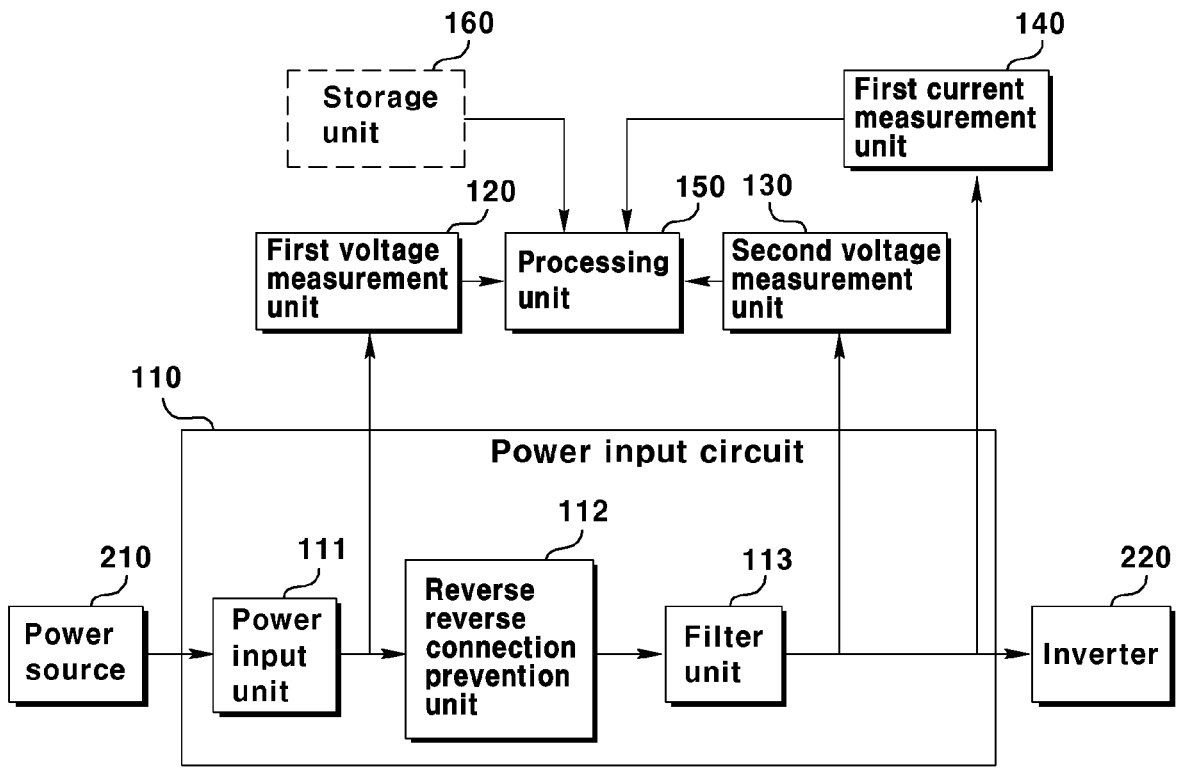
FIG. 1 is a block diagram of a system for diagnosing a failure of a power input circuit according to an embodiment of a first embodiment of the present invention.

FIG. 1 is a block diagram of a system for diagnosing a failure of a power input circuit according to an embodiment of a first embodiment of the present invention.

The power input circuit 110 for which the failure diagnosis system 100 intended to diagnose a failure serves for receiving power from the power source 210 and delivering power to the inverter 220 or other components. Since the voltage of the power being inputted from the power source 210 may be different from the voltage used in the internal device, it serves for delivering voltage to internal devices by converting a voltage into a size that can be used by internal devices. In addition, when the power source 210 is not stable, it is possible to filter it as a stable power source, or to prevent the power from being reversely outputted from the inside to the outside. In addition, it can also convert direct current and alternating current. That is, the power input circuit 110 serves for receiving power from the power source 210 and enabling it to be stably used in an internal device.

To this end, the power input circuit 110 may include a power input unit 111, a reverse connection prevention unit 112, and a filter unit 113. The power input circuit 110 may be a power input circuit 110 of an electronic control unit (ECU) including an inverter that receives power from a vehicle battery and drives a motor. This is an example, and it is natural that, in addition to the vehicle power input circuit, it may be various power input circuits that receive power. Hereinafter, an example in which the power input circuit 110 is a power input circuit of an ECU for a vehicle will be described.

The power input unit 111 is directly connected to the power source 210 to receive power. Here, the power source 210 may be a vehicle battery, and the power input unit 111 may be a connector connected to the power source 210. The reverse connection prevention unit 112 serves to prevent power from being outputted in the reverse direction toward the power source 210 in an ECU, and the filter unit 113 can serve as a filter configured to deliver a stable power to the inverter 220 and the like.

As previously explained, a power being inputted through the power source 210 must be stably delivered to the inverter 220 and the like, but if an abnormality occurs in the power being inputted, a failure may occur in the inverter 220 and the like, therefore the power must be monitored. In order to monitor the power, it is possible to detect a failure by measuring the voltage of the power input circuit. At this time, if it is known exactly where the failure occurred, it is possible to accurately diagnose and respond to the failure.

For an accurate failure diagnosis, a system for diagnosing a failure of a power input circuit 100 according to an embodiment of a first embodiment of the present invention comprises a first voltage measurement unit 120, a second voltage measurement unit 130, a first current measurement unit 140, and a processing unit 150, and may include a storage unit 160.

The first voltage measurement unit 120 measures a first voltage of the rear stage of the power input unit 111.

More specifically, the power input unit 111 is located at the forefront of the power input circuit being inputted power from the power source 210. The first voltage measurement unit 120 measures a first voltage at the rear stage of the power input unit 111 to determine whether there is a failure in the circuit from the power source 210 to the power input unit 111.

The first voltage measurement unit 120 may measure the first voltage using a voltage dividing circuit connected in parallel to a rear stage of the power input unit 111. Here, the voltage dividing circuit may be formed to have a resistance ratio that divides the voltage into a circuit comprising a plurality of resistors. The first voltage may be measured by lowering the voltage to a measurable voltage in the processing unit 150 according to the resistance ratio of the voltage dividing circuit.

The second voltage measurement unit 130 measures a second voltage of a rear stage of the power input circuit 110.

More specifically, in order to protect the ECU including the inverter 220 from failure of input power, the second voltage measurement unit 130 measures a second voltage at a rear stage of the power input circuit 110. As described above, diagnosing failure by measuring voltage is to protect the devices inside the ECU, and in order to monitor a voltage at a position input to the internal device, the second voltage measurement unit 130 measures a second voltage at a rear stage of the power input circuit 110.

Here, the rear stage of the power input circuit 110 may be a DC link stage. The DC link stage is a position where DC power is applied to both ends, and serves to connect between the DC power battery power 210 and the DC-AC inverter 220. That is, the second voltage measurement unit 130 may measure a second voltage at the DC link stage.

Like a first voltage measurement unit 120, a second voltage measurement unit 130 may also measure a second voltage using a voltage dividing circuit connected in parallel to a rear stage of the power input circuit 110. The resistance ratio of the voltage dividing circuit measuring the second voltage may be the same as or different from the resistance ratio of the voltage dividing circuit measuring the first voltage. The resistance ratio of each voltage dividing circuit is for lowering the voltage to a voltage range measurable by the processing unit 150, and the resistance ratio may be determined according to the magnitude of the voltage at each location where the voltage is measured.

The first current measurement unit 140 measures a first current flowing between a terminal measuring the first voltage and a terminal measuring the second voltage.

More specifically, when there is an element between a terminal measuring a first voltage and a terminal measuring a second voltage, a voltage drop may occur, resulting in a difference between the first voltage and the second voltage; when the voltage drop varies according to the magnitude of the current flowing through the device, the relationship between a first voltage and a second voltage may vary. Therefore, in order to calculate the relationship between the first voltage and the second voltage according to the first current, the first current measurement unit 140 measures a first current flowing between the terminals measuring a first voltage and a second voltage, respectively.

The first current measurement unit 140 may measure a first current at the rear stage of the power input circuit. The voltage at the terminal measuring the first voltage and the terminal measuring the second voltage may be different from each other, but the current flowing through a terminal for measuring a first voltage and a terminal measuring a second voltage is the same, and since this is the same as the current flowing from the rear stage of the power input circuit that is the terminal measuring the second voltage, the first current measurement unit 140 may measure a first current at a rear stage of the power input circuit.

Figure 2:
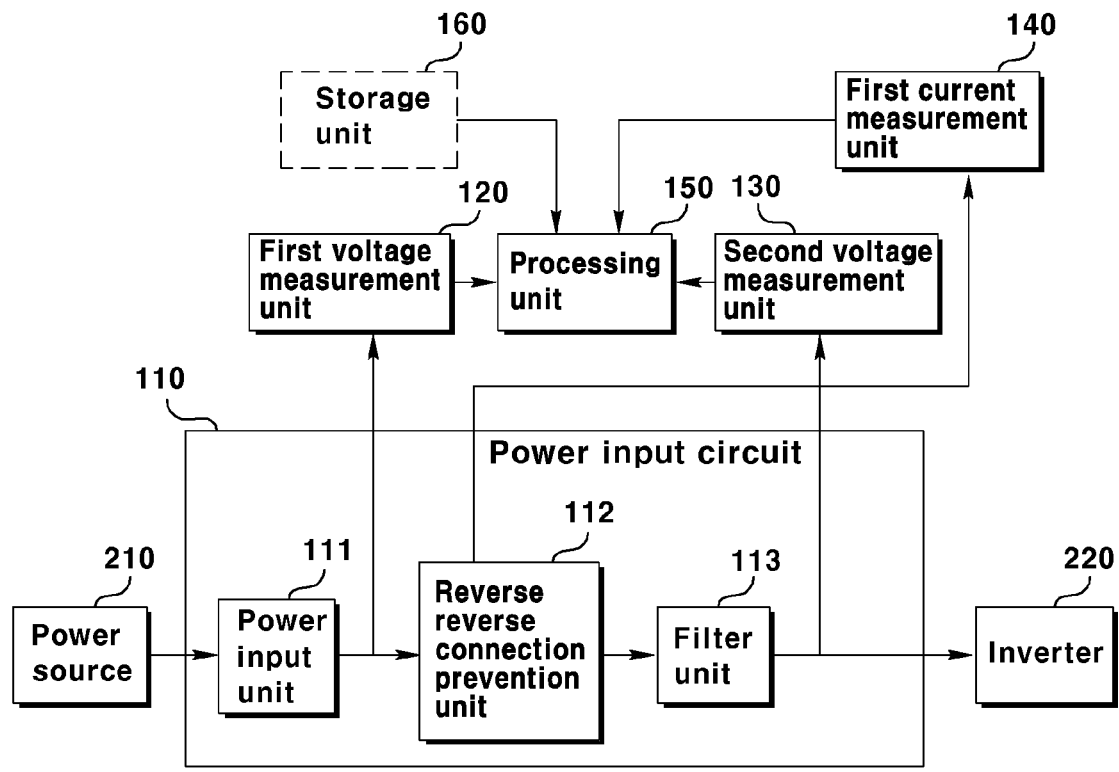
FIG. 2 is a block diagram of a system for diagnosing a failure of a power input circuit according to another embodiment of a first embodiment of the present invention.

Or, the first current measurement unit 140 may measure the first current in the reverse connection prevention unit 112 included in the power input circuit 110 as shown in FIG. 2. The reverse connection prevention unit 112 may be one of the elements positioned between a terminal measuring a first voltage and a terminal measuring a second voltage. As described above, since the current flowing between the terminals measuring a first voltage and a second voltage is the same, the first current measurement unit 140 may measure a first current by using the current flowing through the reverse connection prevention unit 112.

The reverse connection prevention unit may comprise a MOSFET. A MOSFET is a semiconductor device comprising a gate, a source, and a drain. When a voltage is applied to the gate, a channel is formed between the source and the drain, and current flows. When a MOSFET is replaced with an equivalent circuit, it can be expressed as the resistance of Rdson, and a voltage drop occurs due to Rdson. At this time, the current flowing through the MOSFET can be measured using the voltage drop generated by Rdson.

The processing unit 150 derives a voltage drop between a terminal measuring the first voltage and a terminal measuring a second voltage using the first current that has been measured, and determines whether or not a failure occurs and a failure location using the first voltage, the voltage drop, and the second voltage.

More specifically, the processing unit 150 is inputted with: a first voltage from the first voltage measurement unit 120; a second voltage from the second voltage measurement unit 130; and a first current from the first current measurement unit 140. The processing unit 150 derives a voltage drop between the terminal measuring the first voltage and the terminal measuring the second voltage using a first current. The processing unit 150 may be a micro control unit (MCU), and may be implemented as a processing unit separate from the MCU.

The processing unit 150 may have set a measurable range of a voltage. This may be set according to the specifications of the processing unit 150 for the safety of the processing unit 150. A first voltage and a second voltage may be inputted by being lowered to a voltage range that can be measured by the processing unit 150. Even when the actual voltage is lowered, the processing unit 150 may calculate an actual first voltage and a second voltage by using the resistance ratio at each position where the voltage is lowered. For example, 2 V may be inputted to the processing unit 150 through a voltage dividing circuit in which the actual voltage of the second voltage is 5 V and has a resistance ratio of 5:2. At this time, the processing unit 150 may determine that the actual second voltage is 5 V instead of 2 V using the previously stored resistance ratio of 5:2.

The voltage drop between the terminal measuring a first voltage and the terminal measuring a second voltage can be derived using: impedance existing between the terminal measuring a first voltage and the terminal measuring a second voltage; a first current flowing between the terminal measuring the first voltage and the terminal measuring the second voltage; and the following equation.

$$V_{Drop} = R_{total} * I \quad \text{[Equation 1]}$$

The voltage drop according to the first current, that is, the relationship between the first current and the voltage drop in the power input circuit 110 may be stored in the storage unit 160. In the power input circuit 110, since $R_{total}$ is a fixed value when the circuit is not changed, the voltage drop according to the value of the first current may be calculated in advance or an accurate value may be known in advance through an experiment. Accordingly, the storage unit 160 may store the relationship between the first current and the voltage drop according to the first current as a lookup table. When the processing unit 150 receives the first current from the first current measurement unit 140, the processing unit 150 reads out a corresponding lookup table storing the relationship between the first current and voltage drop according to the first current from the storage unit 160, and thus, a voltage drop can be obtained quickly. In case of power failure, since quick response is important, so the amount of computation can be reduced by using a lookup table, and through this, quick response to a failure may become possible.

The processing unit 150 uses a first voltage, a voltage drop, and a second voltage to determine whether failure has occurred and the location of the failure. In a normal operating situation, the relationship between the first voltage and the second voltage is as follows.

$$\text{First voltage} - \text{Voltage drop} = \text{Second voltage} \quad \text{[Equation 2]}$$

When the power input circuit 110 operates normally, the first voltage corresponding to the voltage of the power source 210 may be normal, and the second voltage may be a voltage obtained by subtracting a voltage drop from the first voltage. That is, when the first voltage is within a predetermined range, it may be determined that the first voltage is normal. The normal range of the first voltage may vary according to the voltage of the battery power. It can be set according to the normal range voltage of battery power, or the normal range can be set by applying a certain margin range. In the case when there is a voltage drop between the battery power and the power input unit 111, a normal range may be set in consideration of the corresponding voltage drop. In addition, when the difference between the third voltage obtained by subtracting the voltage drop from the first voltage and the second voltage is less than a threshold value, it may be determined as normal. A threshold value for the difference between the third voltage and the second voltage may vary depending on a device to be protected. It may vary depending on the probability of failure depending on the specifications of the corresponding device. Or, it may be preset by the user. It may be set by applying a constant margin rate.

The processing unit 150 determines whether the first voltage is normal, and when the first voltage is normal, compares the second voltage with a third voltage obtained by subtracting the voltage drop from the first voltage, and may determine whether the failure has occurred and the location of the failure by using a difference between the third voltage and the second voltage. The processing unit 150 may immediately determine whether the first voltage is normal without comparison with the second voltage. When the power source 210 is a battery, the battery voltage may be 12 V to 15 V during normal operation, when the first voltage is out of the normal range of the battery voltage, it may be determined that the first voltage is not normal. Even if the first voltage is normal, the second voltage may not be normal. In order to determine this, the processing unit 150 compares the third voltage obtained by subtracting the voltage drop from the first voltage with the second voltage, and may determine whether a failure has occurred by using the difference between the third voltage and the second voltage.

The processing unit 150 may determine that a failure has occurred when the first voltage is not normal, or when the difference between the third voltage and the second voltage is equal to or greater than a threshold value. When the first voltage is not normal, it is determined that failure has occurred, and even if the first voltage is normal, when the difference between the third voltage and the second voltage is equal to or greater than the threshold value, since the difference between the third voltage and the second voltage becomes more than the threshold value due to a problem other than the normal voltage drop, the processing unit 150 may determine that a failure has occurred.

When the first voltage is not normal, the processing unit 150 determines that a failure has occurred in the preceding stage of the terminal measuring the first voltage, and when the first voltage is normal and the difference between the third voltage and the second voltage is equal to or greater than a threshold value, it may determine that a failure has occurred in a circuit between the terminal measuring the first voltage and the terminal measuring the second voltage. In order to determine not only whether a failure has occurred, but also a location where the failure has occurred, the processing unit 150 may make a different determination depending on the case.

First, when the first voltage is not normal, it may be determined that a failure has occurred in the preceding stage of the terminal measuring the first voltage. When the first voltage is not normal, since a failure has occurred in the power being inputted from the power source 210 or in a circuit in the preceding stage of the power input unit 111, when the first voltage is not normal, it may be determined that a failure has occurred in the preceding stage of the terminal measuring the first voltage.

When the first voltage is normal and the difference between the third voltage and the second voltage is equal to or greater than the threshold value, it may be determined that a failure has occurred in a circuit between the terminal measuring the first voltage and the terminal measuring the second voltage. That the first voltage is normal means that the power being inputted from the power supply 210 is normal, and when a failure occurs in the second voltage even though the first voltage is normal, it can be determined that a failure has occurred in a circuit between the terminal measuring the first voltage and the terminal measuring the second voltage, that is, the power input circuit.

In addition, when the difference between the third voltage and the second voltage in a state where the first voltage is not normal, when the difference between the third voltage and the second voltage is equal to or greater than the threshold value, the processing unit 150 is greater than or equal to a threshold value, it can also be determined that a failure has occurred in both of the preceding stage of the terminal measuring the first voltage and a circuit between the terminal measuring the first voltage and the terminal measuring the second voltage.

The processing unit 150 may determine that both the power supply 210 and the power input circuit 110 are normal when the first voltage is normal and the difference between the third voltage and the second voltage is less than the threshold value.

When it is determined that a failure has occurred, the processing unit 150 may block the power input of the power input unit 111. When it is determined that failure has occurred through the determination of the processing unit 150, the internal devices of the ECU can be protected by cutting off the power input from the power source 210 to the power input unit 111. The processing unit 150 may block the power input and deliver information on this to a higher level controller through an alarm or the like.

Since it is possible to know the location of failure as well as whether or not failure occurs, it is possible to quickly and accurately respond to a failure, remove the cause of the failure, thereby enabling normal operation again.

Figure 3:
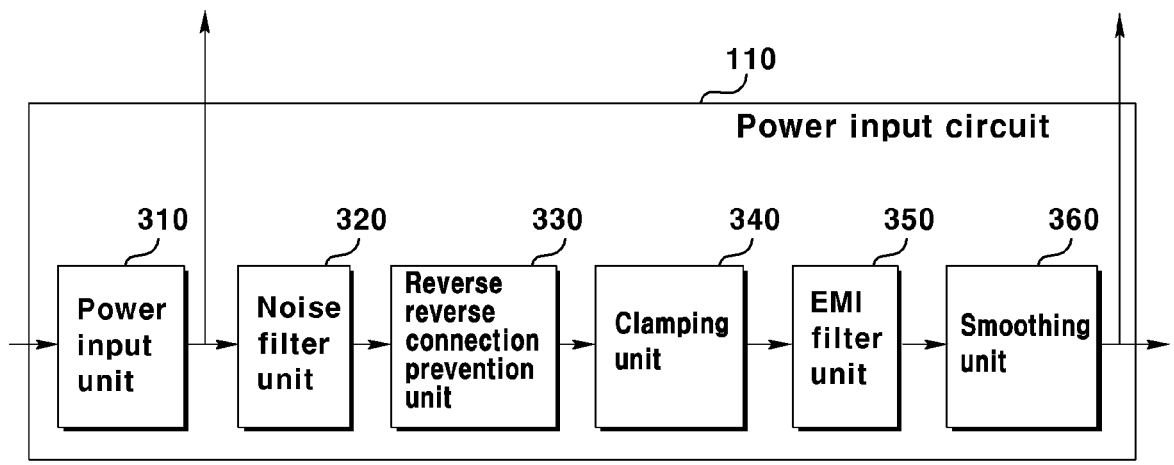
FIG. 3 illustrates a specific implementation example of a power input circuit.
Figure 4:
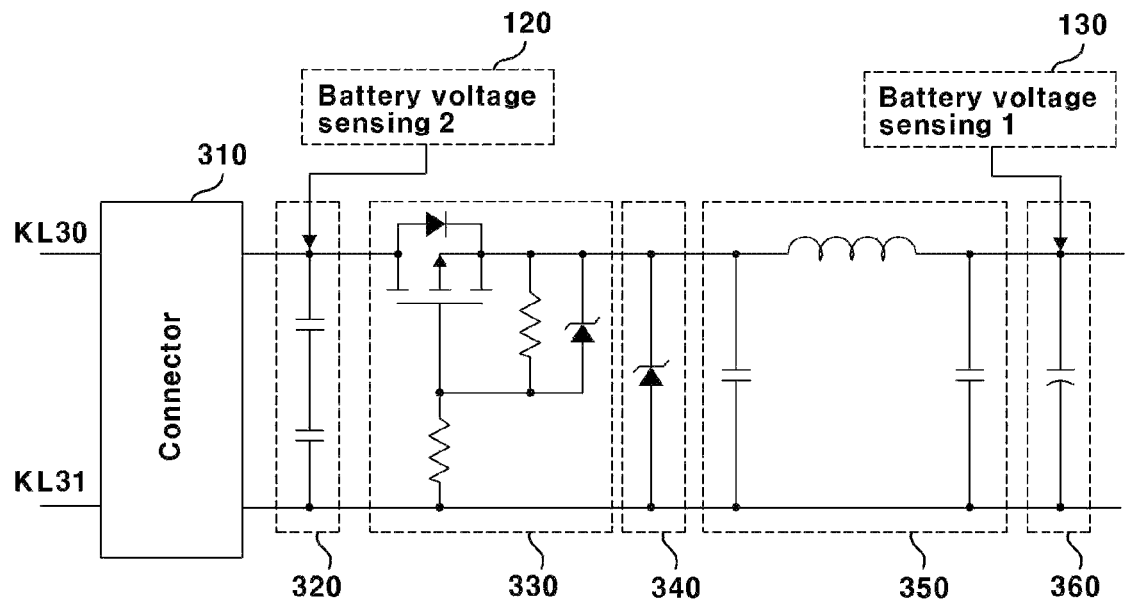
FIG. 4 is a diagram for explaining voltage sensing points in a power input circuit of a system for diagnosing a failure of a power input circuit according to an embodiment of a first embodiment of the present invention.

A power input circuit for diagnosing failure in the failure diagnosis system 100 may be implemented as shown in FIGS. 3 and 4. Specifically, it may include a power input unit 310, a noise filter unit 320, a reverse connection prevention unit 330, a clamping unit 340, an EMI filter unit 350, and a smoothing unit 360. The power input unit 310 may be a connector that receives power, and a plurality of pins such as KL30 and KL31 for battery power input may be formed. The first voltage measurement unit 120 measuring the first voltage may measure the first voltage at the rear stage of the power input unit 310. The noise filter unit 320 removes noise included in the input power, and may be formed of a plurality of capacitors. The reverse connection prevention unit 330 serves to prevent the power of the internal device from being reversely inputted to the power input unit 310, and shown in FIG. 4, it may include a MOSFET, and may further include a resistor and a diode. As explained above, the first current may be measured in the MOSFET included in the reverse connection prevention unit 112. The clamping unit 340 serves to clamp with a predetermined level of power, and may be formed of a diode. The EMI filter unit 350 is formed of an electro-magnetic interference (EMI) filter, a filter for preventing electromagnetic interference, and may be formed of an inductor and a capacitor. The inductor included in the EMI filter unit 350 includes the parasitic resistance RL, so that a voltage drop may occur between the terminal measuring the first voltage and the terminal measuring the second voltage. The smoothing unit 360 serves to evenly smooth the power output according to the preceding filter and the like, and may be formed of a capacitor.

As shown in FIG. 4, the implemented power input circuit senses the battery voltage at two locations 120 and 130 to determine whether or not a failure occurs and a failure location. It can be seen that the device located between the two locations 120 and 130 for sensing the battery voltage is the MOSFET included in the reverse connection prevention unit 330 and the inductor of the EMI filter unit 350.

Accordingly, the voltage drop occurring between the two locations 120 and 130 for sensing the battery voltage can be calculated as follows.

$$V_{Drop} = R_{DSon}*I + R_L*I \quad \text{[Equation 3]}$$

The voltage drop according to the first current calculated as described above may be stored in a lookup table. By using the voltage and voltage drop sensed at the two locations 120 and 130 that sense the battery voltage, it is possible to determine whether there is a failure, and it is possible to know exactly where the failure occurred.

Figure 5:
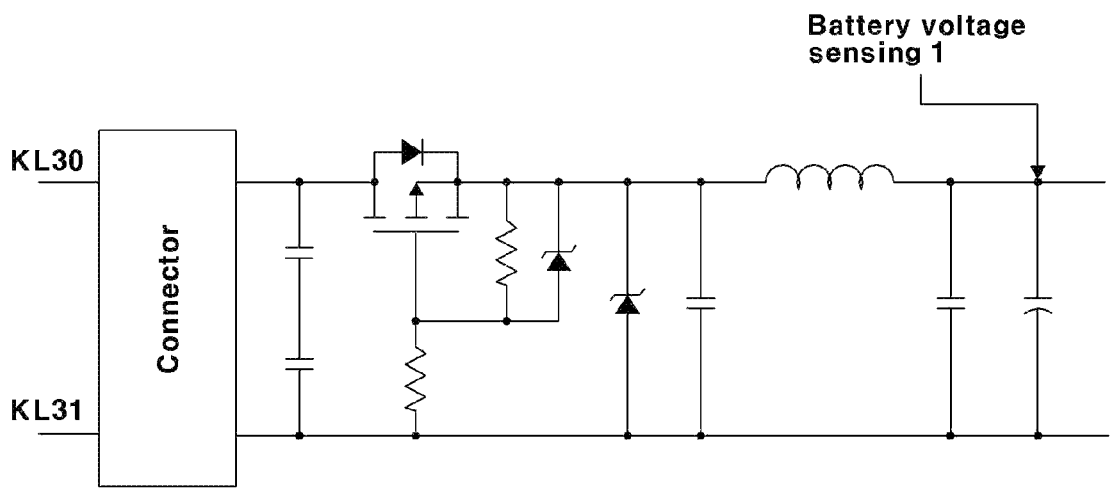
FIGS. 5 and 6 illustrate a comparative example with a system for diagnosing a failure of a power input circuit according to an embodiment of a first embodiment of the present invention.
Figure 6:
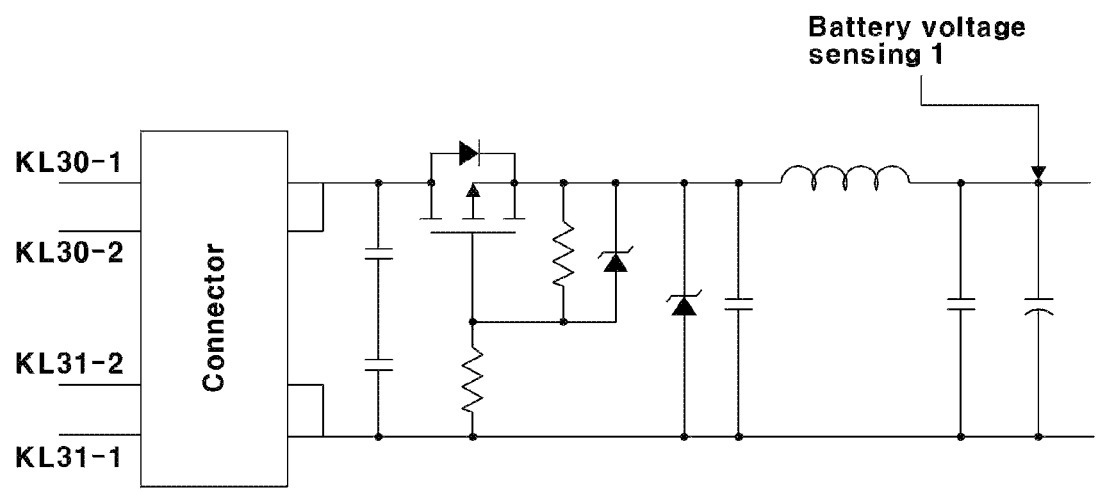

FIGS. 5 and 6 are comparative examples of the failure diagnosis system 100 according to the first embodiment of the present invention, and unlike sensing the voltage at two positions 120 and 130 in the failure diagnosis system 100 according to the embodiment of the first embodiment of the present invention, the voltage can only be sensed at the DC link stage position. In this case, if the component between the connector and the DC link capacitor fails, there is no way to diagnose it, so there is a problem in terms of functional safety. Accordingly, battery voltage monitoring can only be used to calculate efficiency or to perform an action when a low voltage occurred. In case of failure, in order to determine whether the power supply is the problem or the internal circuitry is the problem, as shown in FIG. 6, pins KL30 and KL31 at the end of connector can be used by arranging two pins each, and in this case, there is a problem in that the size of the connector increases and the cost increases.

Unlike FIGS. 5 and 6, the system for diagnosing a failure of a power input circuit according to an embodiment of a first embodiment of the present invention increases the coverage of failure diagnosis by adding voltage sensing points, reduces material cost and enables simple circuit implementation than to increase the number of pins of the connector to improve the function of failure diagnosis.

Figure 7:
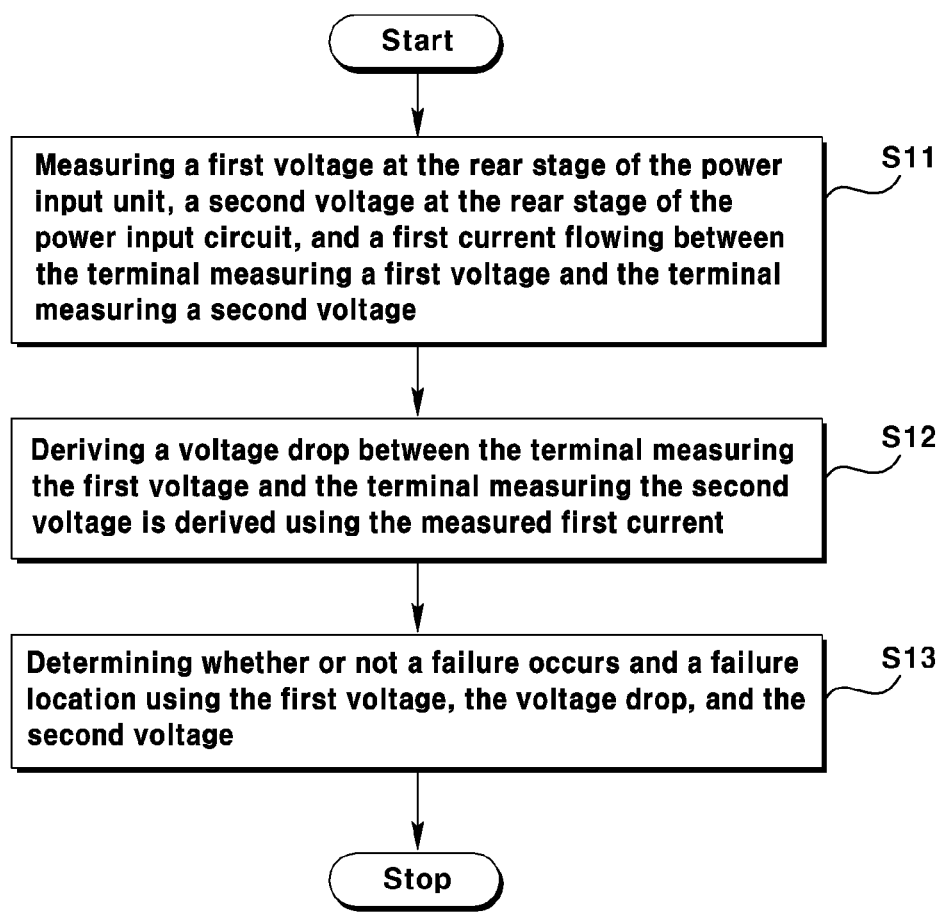
FIG. 7 is a flowchart of a method for diagnosing a failure of a power input circuit according to an embodiment of a first embodiment of the present invention.
Figure 8:
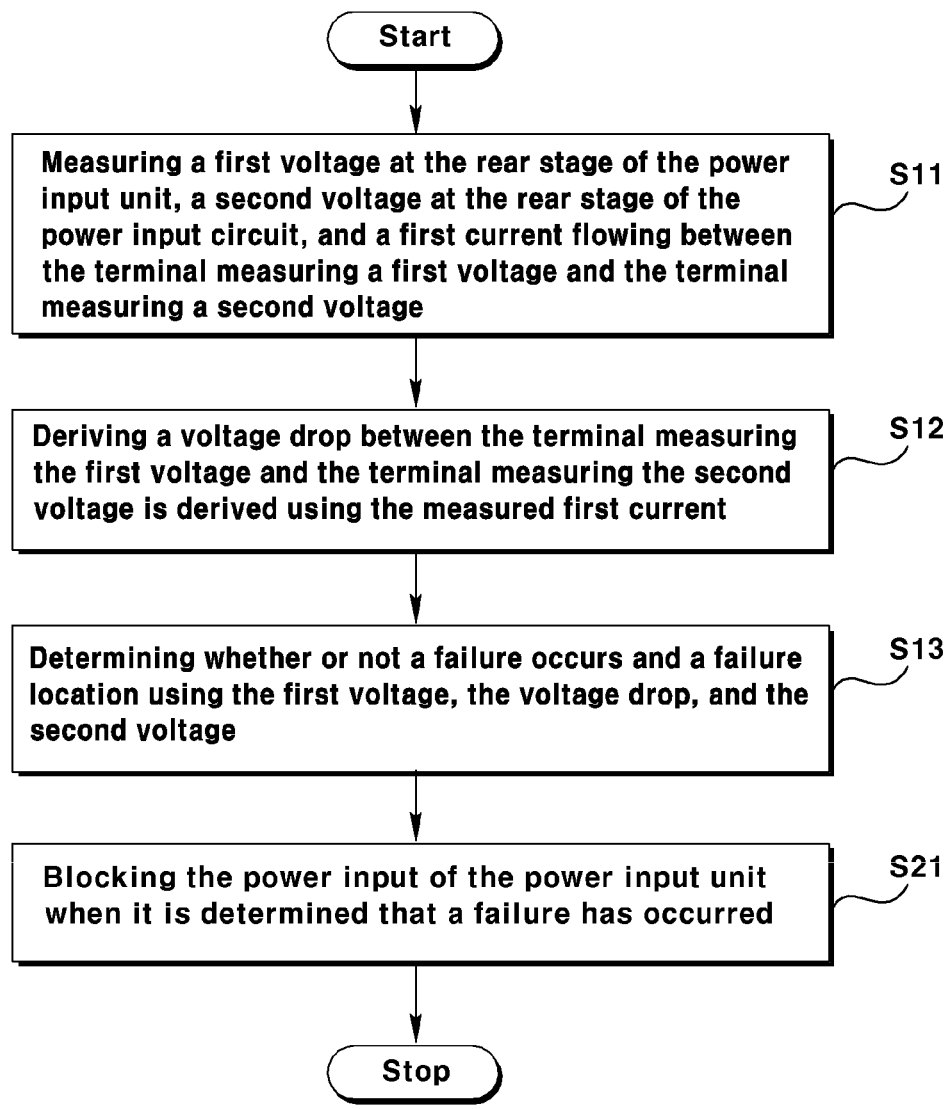
FIGS. 8 to 10 are flowcharts of a method for diagnosing a failure of a power input circuit according to another embodiment of a first embodiment of the present invention.
Figure 9:
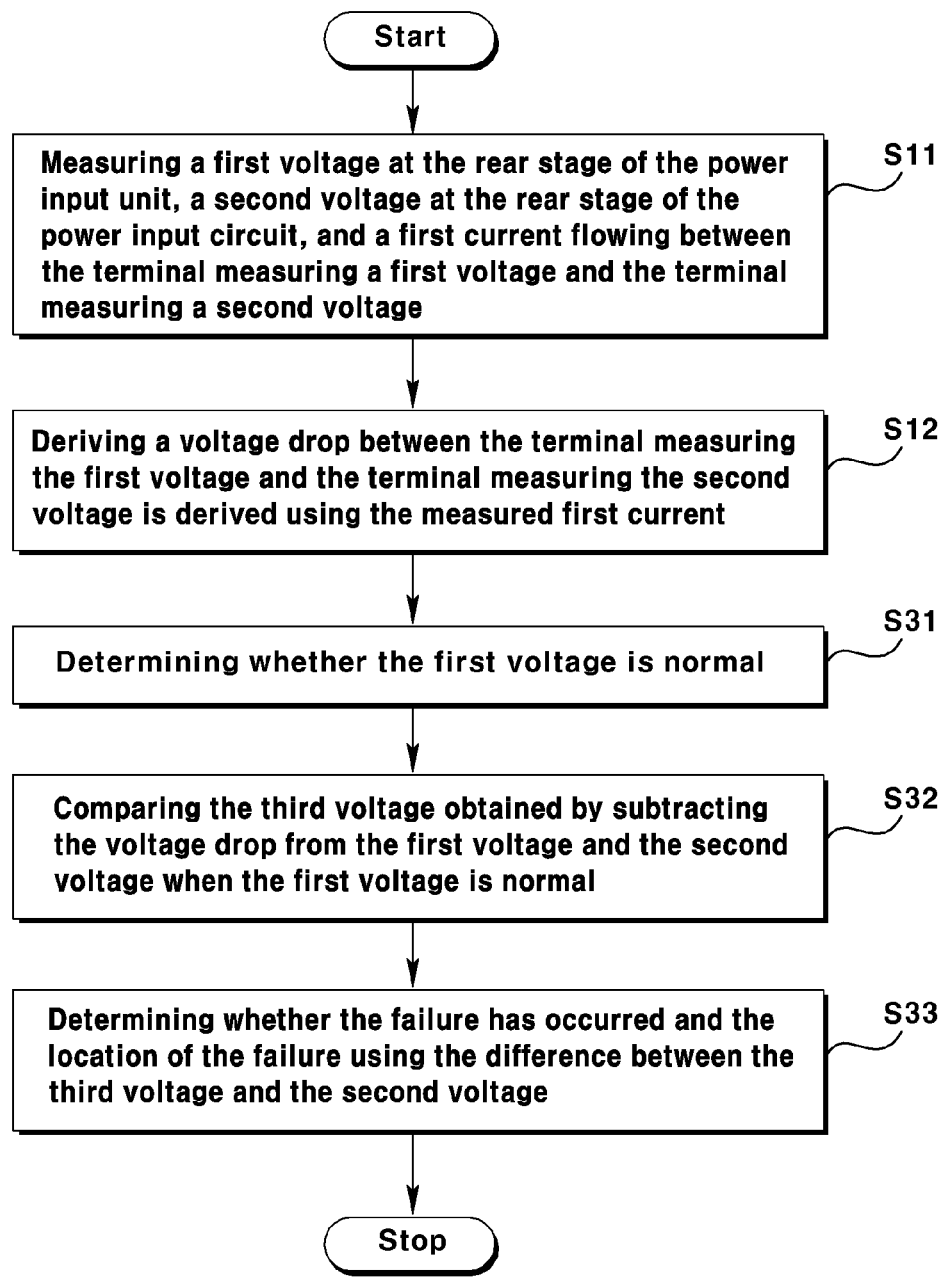
Figure 10:
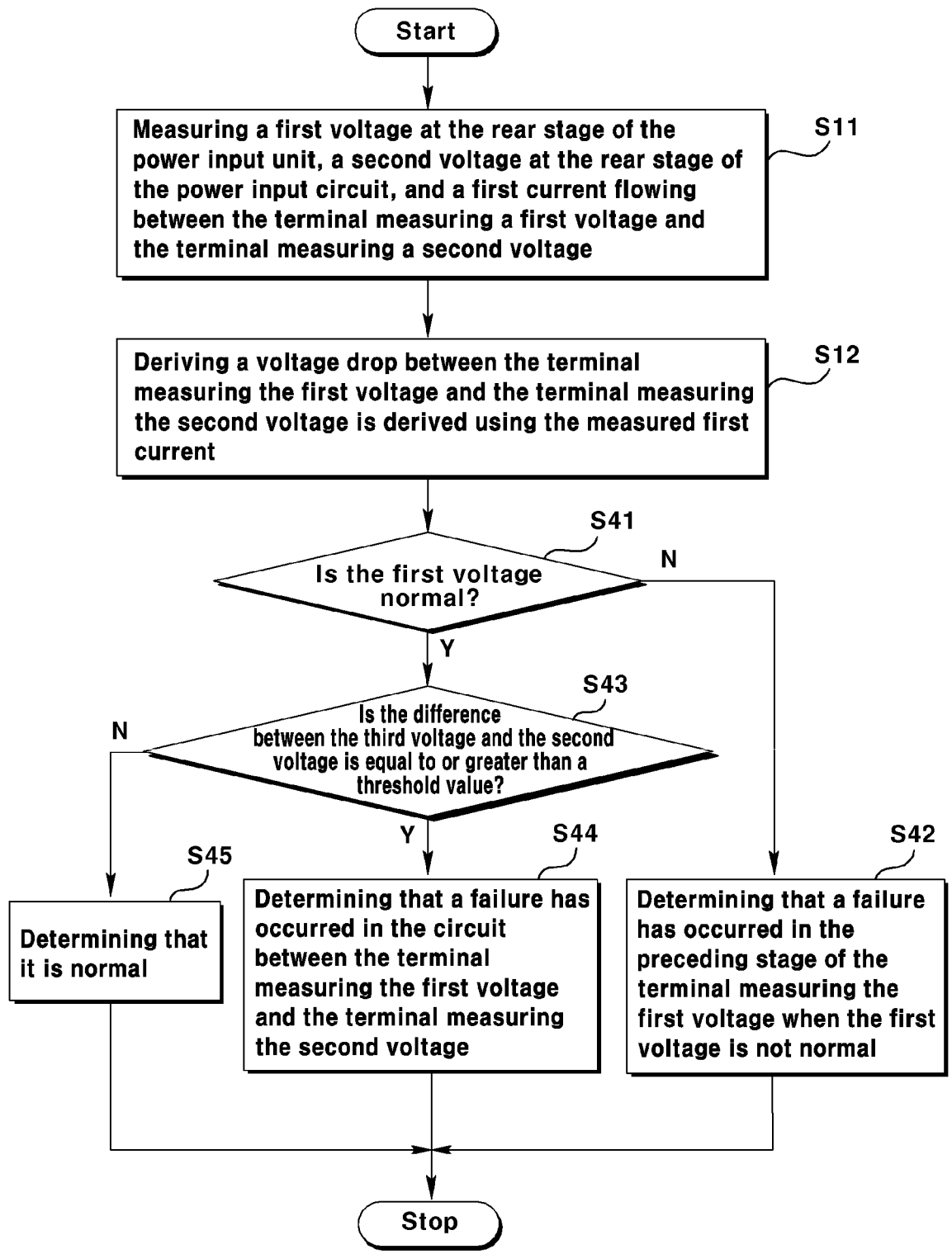

FIG. 7 is a flowchart of a method for diagnosing a failure of a power input circuit according to an embodiment of a first embodiment of the present invention, and FIGS. 8 to 10 are flowcharts of a method for diagnosing a failure of a power input circuit according to another embodiment of a first embodiment of the present invention. The detailed description of each step of FIGS. 7 to 10 corresponds to the detailed description of the failure diagnosis of FIGS. 1 to 6, and thus the overlapping description will be omitted. Each of the steps of FIGS. 7 to 10 may be performed in one or more processing units.

To diagnose the failure of a power input circuit, first, in step S11, a first voltage at the rear stage of the power input unit, a second voltage at the rear stage of the power input circuit, and a first current flowing between the terminal measuring a first voltage and the terminal measuring a second voltage are measured. At this time, the first current may be measured at the rear stage of the terminal measuring the second voltage. Or, the first current may be measured in a MOSFET located between the terminal measuring the first voltage and the terminal measuring the second voltage. Here, the MOSFET may be a MOSFET included in the reverse connection prevention unit.

When the first current is measured, a voltage drop between the terminal measuring the first voltage and the terminal measuring the second voltage is derived using the measured first current in step S12. In deriving the voltage drop, the voltage drop may be derived from a lookup table in which the relationship between the first current and the voltage drop according to the first current is stored.

Thereafter, in step S13, it is determined whether or not a failure occurs and a failure location using the first voltage, the voltage drop, and the second voltage.

The process of determining whether failure occurs and the location of failure may be performed through steps S31 to S33. In step S31, it is determined whether the first voltage is normal; when the first voltage is normal, the third voltage obtained by subtracting the voltage drop from the first voltage in step S32 and the second voltage are compared; and in step S33, it may be determined whether the failure has occurred and the location of the failure using the difference between the third voltage and the second voltage.

At this time, when the first voltage is not normal, or when the difference between the third voltage and the second voltage is equal to or greater than a threshold value, it can be determined that a failure has occurred in the power input circuit; regarding the failure occurrence location, when the first voltage is not normal, it is determined that failure has occurred in the preceding stage of the terminal measuring the first voltage; and when the first voltage is normal and the difference between the third voltage and the second voltage is equal to or greater than a threshold value, it may be determined that a failure has occurred in a circuit between the terminal measuring the first voltage and the terminal measuring the second voltage.

Regarding the occurrence of a failure and the location of the failure, as shown in FIG. 10, first, it is determined whether the first voltage is normal (S41). As a result of the determination in step S41, when the first voltage is not normal, it may be determined that a failure has occurred in the preceding stage of the terminal measuring the first voltage (S42). As a result of the determination in step S41, if the first voltage is normal, it may be determined whether a difference between the third voltage obtained by subtracting the voltage drop from the first voltage and the second voltage is equal to or greater than a threshold value (S43). As a result of the determination in step S43, when the difference between the third voltage and the second voltage is less than the threshold value, failure does not occur and the power input circuit may be determined to be normal (S45). As a result of the determination in step S43, when the difference between the third voltage and the second voltage is equal to or greater than the threshold value, it may be determined that a failure has occurred in the circuit between the terminal measuring the first voltage and the terminal measuring the second voltage (S44).

When it is determined that a failure has occurred, the power input of the power input unit may be blocked in step S21. To protect the device and circuit, the power input of the power input unit can be blocked, and it can be delivered through an alarm and the like to a higher level controller.

As described above, the failure diagnosis method and the system according to the first embodiment of the present invention have been described with reference to FIGS. 1 to 10. Hereinafter, a motor driving device and a motor emergency braking method according to a second embodiment of the present invention will be described with reference to FIGS. 11 to 20. A detailed description of the motor driving device and the motor emergency braking method according to the second embodiment of the present invention is based on the failure diagnosis method and its system and names, terms, and functions according to the first embodiment of the present invention and the detailed description of each embodiment, and may be the same as or different from each other.

Hereinafter, a configuration of a motor driving device and a motor emergency braking method according to a second embodiment of the present invention will be described with reference to the drawings.

Figure 11:
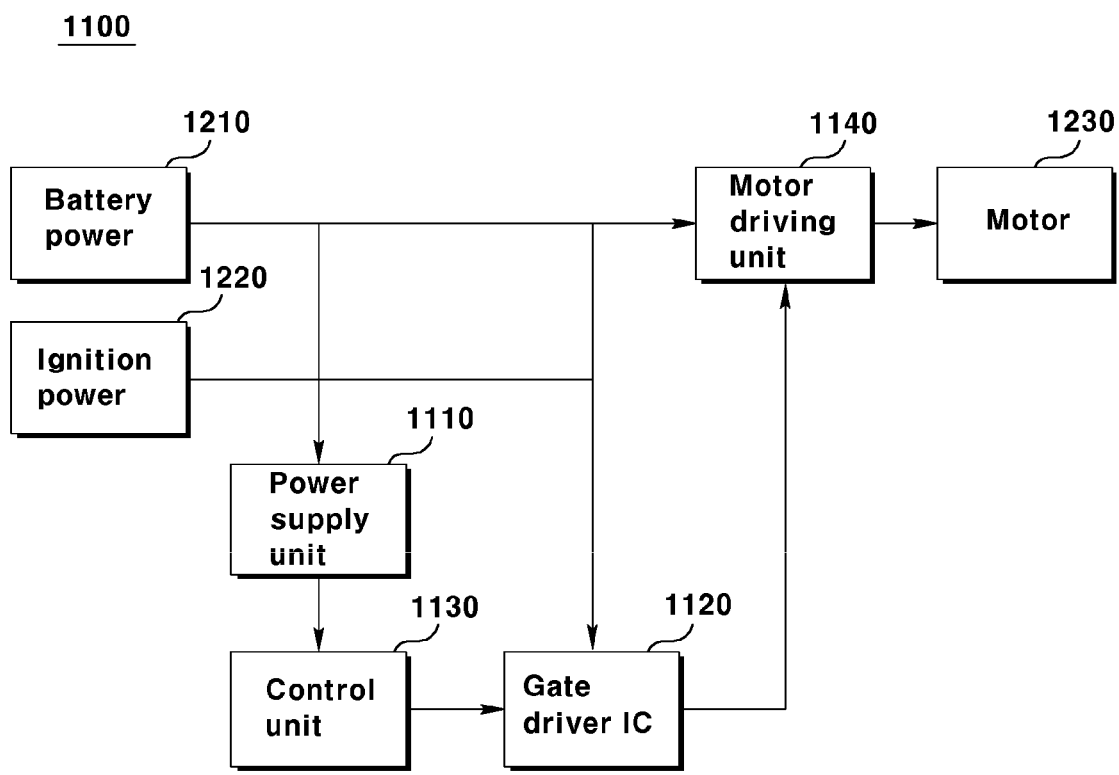
FIG. 11 is a block diagram of a motor driving device according to an embodiment of a second embodiment of the present invention.
Figure 12:
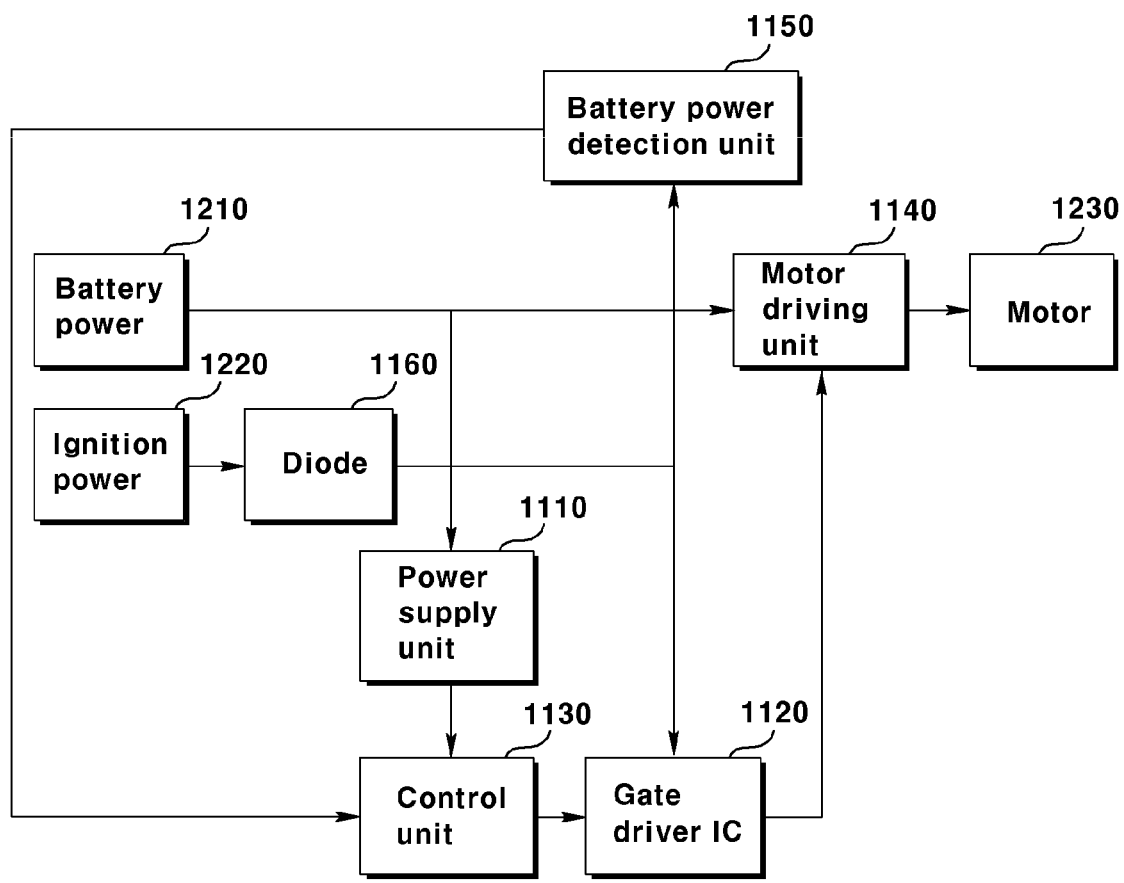
FIG. 12 is a block diagram of a motor driving device according to another embodiment of a second embodiment of the present invention.

FIG. 11 is a block diagram of a motor driving device according to an embodiment of a second embodiment of the present invention.

A motor driving device 1100 according to an embodiment of the second embodiment of the present invention comprises a power supply unit 1110, a gate driver 1120, a control unit 1130, and a motor driving unit 1140, and may include a battery power sensing unit 1150 and a diode 1160.

The power supply unit 1110 receives battery power 1210 or ignition power 1220 to supply power to the control unit 1130.

More specifically, the power supply unit 1110 supplies a power to the control unit 1130. At this time, the power supply unit 1110 receives a power from the battery power 1210 or the ignition power 1220, and converts the power to be suitable to the control unit 1130, and may supply the power that has been converted to the control unit 1130. During normal operation, it receives battery power 1210 and supplies a power to the control unit 1130, and when it is difficult to receive the battery power 1210 normally and supply it to the control unit 1130, a power may be received from the ignition power 1220 and supplied to the control unit 1130. Battery power is a power being inputted from the battery. An ignition is an ignition device, and an ignition power is a power for starting a vehicle and supplies a power to turn an alternator. In addition, the ignition power enables other parts to make the parts of the vehicle operate. The ignition power is turned on when the key is in the key box or just before the ignition of the vehicle. In the case of a vehicle, battery power is inputted through the lines KL30 and KL31, and ignition power is inputted through KL15.

The power supply unit 1110 may be a power management IC (PMIC). A PMIC is a device performing the role of converting, distributing and controlling the power required inside the device for optimal power supply performance. Through the PMIC, it is possible to efficiently manage power by actively responding to various load fluctuations.

The gate driver 1120 receives the battery power 1210 or the ignition power 1220 to operate switches inside the motor driving unit 1140.

More specifically, the motor driving unit 1140 includes switches, and drives a motor 1230 through switching operation. The gate driver generates a signal for turning ON/OFF a switch comprising the motor driving unit 1140 and transmits it to the motor driving unit 1140, and receives a control signal from the control unit 1130 regarding which switch among the switches comprising the motor driving unit 1140 should be turned ON and which switch should be turned OFF, thereby operating the switch of the motor driving unit 1140 by turning the switch ON or OFF accordingly.

The gate driver may be a gate driver IC. The gate driver IC a device which controls ON/OFF of a switch by applying or blocking a voltage to the gate of a switch being comprised of an IGBT or MOSFET, which is a switching element, may receive a logic level voltage and provide a higher power output than that.

The control unit 1130 receives a power from the power supply unit 1110 and controls the gate driver 1120.

More specifically, the control unit 1130 operates by receiving power from the power supply unit 1110, and controls the gate driver 1120, in driving the motor 1230, to transmit an ON/OFF signal for each switch of the motor driving unit 1140 in order to control the operation of the switch of the motor driving unit 1140. The control unit 1130 may control various components inside the motor driving device 1100 in addition to the gate driver 1120, and detect various information generated by the motor driving device 1100 and control so that the corresponding operation is to be performed, or may generate alarms for higher level controllers or vehicle systems.

The control unit 1130 may be a micro controller unit (MCU). An MCU is a device in which the microprocessor and input/output are integrated into one chip for performing a specified function, and serves to control various functions required inside the motor driving device 1100.

The motor driving unit 1140 receives battery power 1210 to drive the motor 1230.

More specifically, the motor driving unit 1140 receives battery power and supplies it to the motor 1230 to drive the motor 1230. The motor driving unit 1140 may be comprised of a plurality of switches, and supplies power capable of driving the motor 1230 by operating the switch according to the signal of the gate driver 1120. Here, the motor 1230 may be a motor that operates a gear of the vehicle. That is, the motor driving device 1100 may be an electronic control unit (ECU) that drives a motor that operates a gear of the vehicle. In addition, it may be a device for driving various motors 1230.

The motor driving unit 1140 may be formed of three upper switches and three lower switches. One upper switch and one lower switch may be connected to each other to form a pair to form one half-bridge circuit. That is, the motor driving unit 1140 may be formed of three half-bridge circuits. At this time, the upper and lower switches can be conducted complementarily. The upper switch and the lower switch forming the half bridge are conducted complementarily with each other, and power can be supplied to the motor 1230. In each switch of the motor driving unit 1140, the upper switch and the lower switch may be conducted complementarily according to the signal of the gate driver 1120. At this time, the control unit 1130 may control the duty ratio of the signal being outputted from the gate driver 1120 to each switch, thereby controlling the operation of the switch. The three half-bridge circuits may supply three-phase power having different phases to the motor 1230. The motor driving unit 1140 may convert DC power into three-phase AC power through six switch operations and supply it to the motor 1230, and since DC power is converted into AC power, it can be referred to as an inverter.

The power supply unit 1110 and the gate driver 1120 receive the ignition power 1220 when an abnormality occurs in the supply of the battery power 1210. The battery power 1210 may be a battery power (KL30) input terminal receiving power from a battery, and the ignition power 1220 may be an ignition power (KL15) input terminal receiving power from an ignition. The power supply unit 1110 and the gate driver 1120 receive power from the battery power 1210 under a normal situation, but when an abnormality occurs in the supply of battery power 1210, since it is difficult to receive normal power from the battery power 1210, it operates by receiving power from the ignition power 1220 rather than the battery power 1210. That is, in an emergency in which it is difficult to supply the battery power 1210, the ignition power 1220 is inputted and an emergency operation is performed.

To this end, the battery power supply line and the ignition power supply line may be connected to be connected to the power supply unit 1110 and the gate driver 1120. The power supply unit 1110 and the gate driver 1120 are not only connected to the battery power supply line being supplied with the battery power 1210, but also connected to the ignition power supply line being supplied with the ignition power 1220, and in order to receive battery power 1210 during normal operation and ignition power 1220 in case of emergency, the supply lines of the battery power 1210 and the ignition power 1220 are connected to each other, thereby being connected to the power supply unit 1110 and the gate driver 1120.

It may include a diode connecting the ignition power 1220 and the power supply unit 1110 and the gate driver 1120. In connecting the battery power supply line and the ignition power supply line, a diode 1160 may be formed in the ignition power supply line. During normal operation, since the current flowing in the battery power supply line is large, the current from the battery power supply line may flow to the ignition power supply line because the ignition power supply line and the battery power supply line are connected, and in this case, the ignition power 1220 may affect other parts supplied. Accordingly, the diode 1160 serves to prevent reverse connection so that the current flowing in the battery power supply line does not flow to the ignition power supply line. In addition, during normal operation, only battery power 1210 should be supplied to the power supply unit 1110 and the gate driver 1120, and by forming the diode 1160, when the current flowing in the battery power supply line is large, the diode can block the input from the ignition power supply line so that only battery power 1210 may be supplied to the power supply unit 1110 and the gate driver 1120. In an emergency in which the battery power 1210 is not available, since there is no current flowing in the battery power supply line or a current smaller than the current flowing in the ignition power supply line flows, current can be supplied from the ignition power supply line at this time. By using the diode 1160, the battery power 1210 and the ignition power 1220 can be stably provided to the power supply unit 1110 and the gate driver 1120 without any other configuration.

At this time, the diode may use a plurality of diodes. By connecting and using a plurality of diodes in series rather than using one diode, the stability of reverse connection prevention can be improved, and stable operation becomes possible.

When an abnormality occurs in the supply of battery power, the control unit 1130 may control the gate driver 1120 to operate the motor driving unit 1140 in the motor braking mode. When an abnormality occurs in the supply of battery power, that is, in an emergency, an abnormality may also occur in the supply of battery power to the motor driving unit 1140, and in this case, it means a situation in which it is difficult to normally operate the motor 1230. When it is difficult to drive the motor 1230 using the battery power 1210 in a case when the supply of battery power 1210 is difficult and waiting for the motor 1230 itself to be stopped, since the motor 1230 may not be stopped stably, a safety problem may occur. Accordingly, the control unit 1130 may control the gate driver 1120 so that the motor 1230 can be stopped safely and stably, thereby enabling the motor driving unit 1140 to be operated in a motor braking mode. Since the motor driving unit 1140 operates in a motor braking mode, even in an emergency, the motor 1230 does not operate without control, and can be stably stopped by the motor braking mode.

When an abnormality occurs in the supply of battery power 1210 and the motor 1230 needs to be stopped stably, the control unit 1130 may control the gate driver 1120 such that a short circuit is formed in an upper switch or a lower switch forming the motor driving unit 1140. When a short circuit is formed in the upper switch or a short circuit is formed in the lower switch, the motor driving unit 1140 may stop the operation of the motor 1230 by operating in a motor braking mode.

A short circuit in the upper switch may be formed by turning on all the upper switches of the motor driving unit 1140 and turning off all the lower switches, and a short circuit in the lower switch may be formed by turning on all the lower switches of the motor driving unit 1140 and turning off all the upper switches. Accordingly, the control unit 1130 may control the gate driver 1120 in order to turn on only the upper switches or lower switches forming the motor driving unit 1140 so that the motor driving unit 1140 can be operated in a motor braking mode.

When an abnormality occurs in the supply of battery power 1210, the control unit 1130 may pull-up the upper switch forming the motor driving unit 1140 to a first voltage and turn off the lower switch, or pull-down the lower switch forming the motor driving unit 1140 to the ground voltage and turn off the upper switch. Each of the connection lines for the upper switch among the connection lines forwarding a signal from the control unit 1130 to the gate driver 1120 may be connected to a first voltage output line being supplied from the power supply unit 1110, and each connection line to the lower switch can be connected to ground (GND). Here, the first voltage is a voltage distinct from the ground, and may be, for example, 3.3 V. Pull-up means forcibly raising the value to a predetermined value, and pull-down means forcibly lowering the value to a predetermined value. In an emergency, the control unit 1130 may stop the motor 1230 by pulling-up all upper switches to the first voltage, and by turning off all lower switches to form a short circuit in the upper switch. Or, in an emergency, all the lower switches are pulled down to ground, and the upper switches are all turned off to form a short circuit in the lower switch to stop the motor 1230.

When an abnormality occurs in the supply of battery power 1210, the control unit 1130 may control a pulse width modulation signal being outputted from the gate driver 1120. The gate driver 1120 operates switches of the motor driving unit 1140 through a pulse width modulation (PWM) signal, and during normal operation, transmits a signal by modulating the pulse width of each switch of the motor driving unit 1140 so that the motor driving unit 1140 can supply three-phase power to the motor 1230. However, in order to stop the motor 1230 in an emergency, each switch of the motor driving unit 1140 must be operated differently from normal operation, and to this end, the control unit 1130 may control the pulse width modulation signal being outputted from the gate driver 1120. For example, as described above, in order for the motor driving unit 1140 to operate in a motor braking mode, the pulse width modulation signal of the gate driver 1120 may be controlled to turn on both the upper switch and the lower switch.

When an abnormality occurs in the supply of battery power 1210, the control unit 1130 may forward alarms to higher level controllers or vehicle systems. In case of an emergency, the control unit 1130 may forward an alarm to a higher level controller or a vehicle system while performing an operation to stop the motor 1230, or at the same time or after the emergency has occurred. Information indicating that the motor 1230 is stopped may be forwarded together. By forwarding information that an abnormality has occurred in the supply of battery power 1210 to a higher level controller or vehicle system, it is possible to perform the operation of the higher level controller accordingly, and afterwards, it may help to determine the cause of the failure.

The battery power detection unit 1150 may detect the battery power 1210. The battery power detection unit 1150 may detect battery power and forward battery power detection information to the control unit 1130, so that the control unit 1130 may monitor the battery power 1210. The battery power detection unit 1150 may be configured in various ways using a voltage dividing circuit, a transistor, and the like.

When an abnormality occurs in the supply of battery power, the power supply unit 1110 and the gate driver 1120 perform the operation by receiving power from the ignition power 1220, but should perform an operation to stop the motor 1230. In order to respond quickly in an emergency, the control unit 1130 can quickly determine that there is an abnormality in the supply of the battery power 1210 according to the signal forwarded from the battery power detection unit 1150, and it is possible to quickly and stably stop the motor 1230. In addition, since it can be clearly seen that there is an abnormality in the battery power 1210, it can be possible to monitor and identify the cause of failure by providing this information to a higher level controller or vehicle system.

When an abnormality occurs in the supply of battery power 1210, the power supply unit 1110 and the gate driver 1120 may be inputted the ignition power 1220 for a predetermined time. The power supply unit 1110 and the gate driver 1120 may be operated by receiving the ignition power 1220 in an emergency, but since the ignition power 1220 is supplied as an emergency power source and the ignition power 1220 is also provided to other devices, it may be difficult to continue using the ignition power 1220. Thus, ignition power 1220 is supplied only until the motor 1230 is stably stopped, and when a predetermined time elapses, the supply of the ignition power 1220 may be cut off. The time, for which the ignition power 1220 is supplied, may be a time required to brake the motor 1230 or may be preset by a user. Or, the ignition power 1220 may be input until the motor 1230 stops or the speed of the motor 1230 becomes less than or equal to a predetermined speed.

Figure 13:
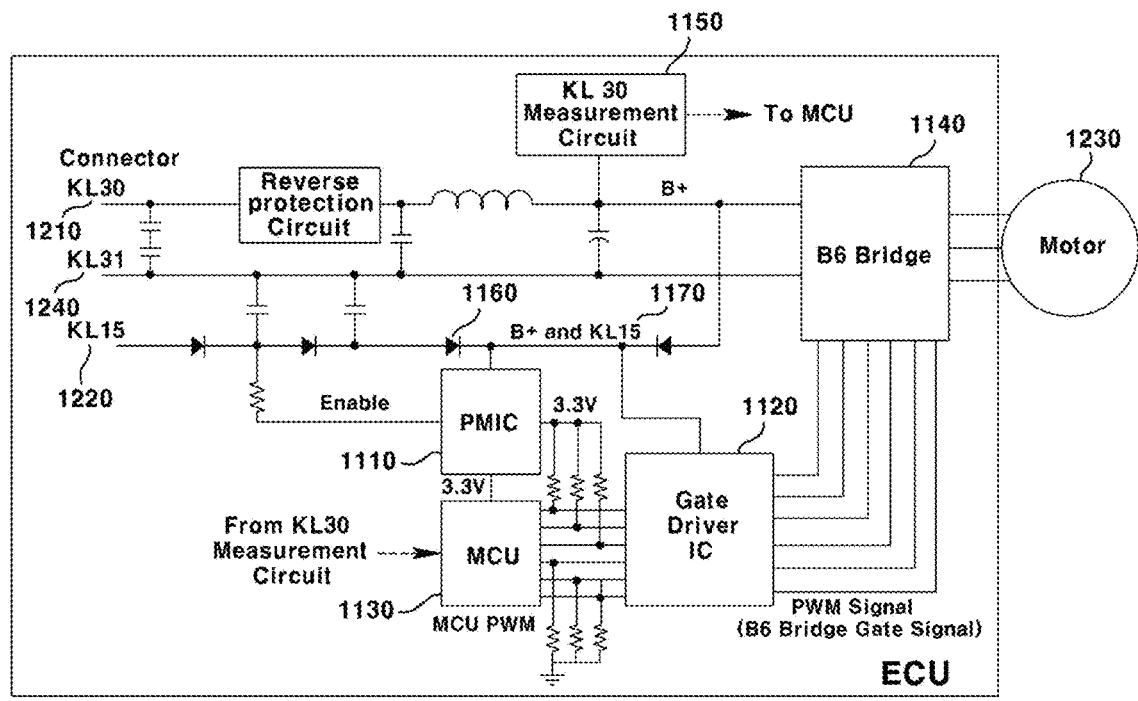
FIG. 13 illustrates an implementation example of a motor driving device according to an embodiment of a second embodiment of the present invention.

The motor driving device according to the second embodiment of the present invention may be implemented as shown in FIG. 13. Battery power may be inputted to the KL30 (1210), and the ground may be connected to the KL31 (1240). The ignition power can be input as KL15 (1220). The battery power 1210 is inputted through the reverse protection circuit to be branched from the B+ stage and supplied to a motor driving unit 1140 comprising a B6 bridge, a power supply unit 1110 that is a PMIC, and a gate driver 1120. Battery power, that is, when power to the KL30 is not supplied, ignition power, that is, to supply power from the line KL15, line B+(KL30) and line KL15 are connected, thereby supplying power to the power supply unit 1110 and the gate driver 1120. During normal operation, the power supply unit 1110 and the gate driver 1120 are inputted with the battery power 1210 being inputted from the B+ stage is received, and when an abnormality occurs in the supply of battery power 1210, it is inputted with the ignition power 1220. During normal operation, a diode 1160 is formed so that the ignition power is not supplied and reverse voltage and current do not flow. The power supply unit 1110 provides power by transforming the voltage to 3.3 V to be suitable for the control unit 1130 that is an MCU. The control unit 1130 controls the gate driver 1120 so that the gate driver 1120 forwards a signal that operates the switches of the motor driving unit 1140. At this time, the control unit 1130 may pull up the upper switch to 3.3 V, and pull down the lower switch to ground. Each signal line may be connected to a 3.3 V output line being outputted from the power supply unit 1110 or may be connected to a ground. The gate driver 1120 may operate the motor driving unit 1140 by applying power supplied according to the control signal of the control unit 1130 to each switch of the corresponding motor driving unit 1140, and accordingly, the motor driving unit 1140 drives the motor 1230 by applying three-phase power to the motor 1230. The battery power detection unit 1150 that is the KL30 measurement circuit detects battery power at the B+ stage and transmits it to the control unit 1130. In order to detect battery power and stably stop the motor 1230 in an emergency, the control unit 1130 controls the gate driver 1120 so that the switch of the motor driving unit 1140 operates in a motor braking mode. Through this, even if the battery power supply is stopped, the motor driving device may not stop operating, the control unit 1130 can recognize a failure situation and stably brake the motor 1230 by floating the PWM terrain in the gate driver 1120, thereby operating the high side or low side braking mode for more than 50 ms.

Figure 14:
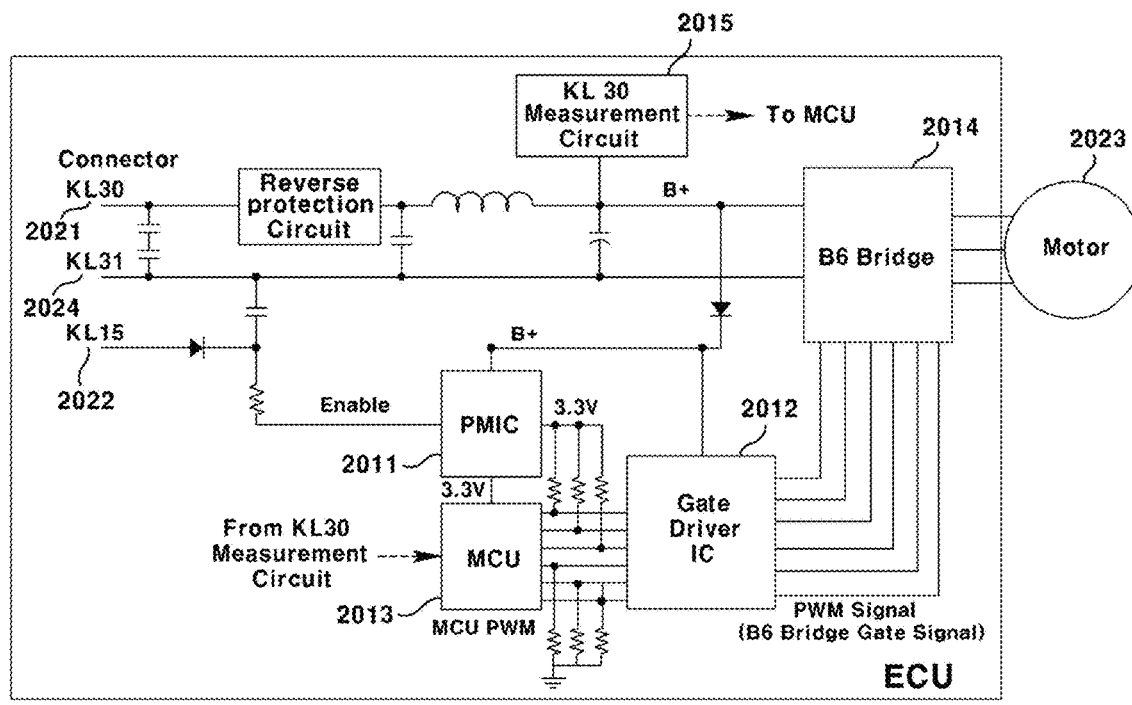
FIG. 14 is a view illustrating a comparative example of a motor driving device according to a second embodiment of the present invention.

Unlike FIG. 13, in FIG. 14, the PMIC 2011 and the gate driver IC 2012 receive power only through the lines KL30 (2021) and KL31 (2024) that are battery power. The B6 bridge 2014 is connected to the line KL30 to drive the motor 2023. The ignition line KL15 (2022) is used only as a signal to enable the PMIC 2011, when the KL15 (2022) signal is turned on, the PMIC 2011 supplies power to a component inside the ECU to turn on the MCU 2013, and other components operate according to the control of the MCU 2013. When the supply of KL30 (B+) is interrupted by external or internal factors, PMIC 2011 and gate driver IC 2012 may not be operated and suddenly shut down, and in a situation where the motor 2023 is being driven, it is impossible to control the motor 2023 so that the motor 2023 cannot be stably braked. Also, information on the fault situation cannot be forwarded to a higher level controller.

Figure 15:
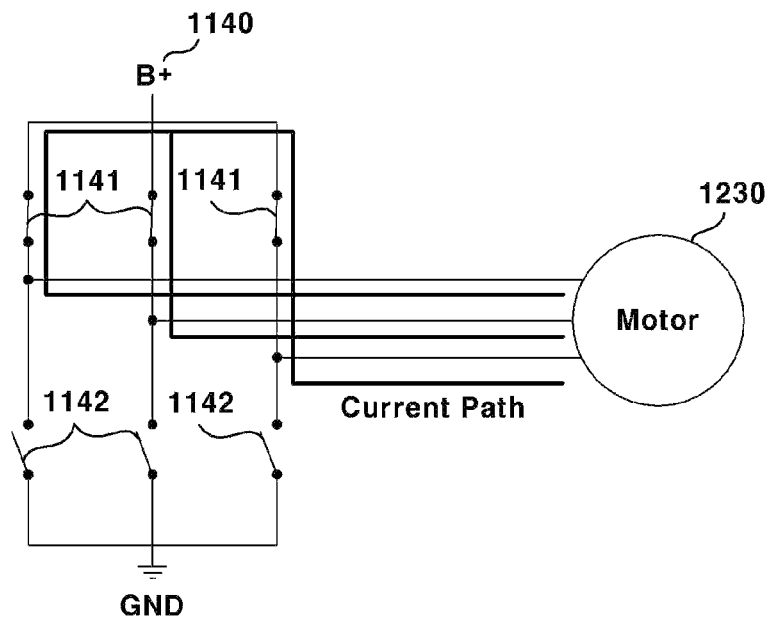
FIGS. 15 to 18 are diagrams for explaining an operation of a motor driving device according to a second embodiment of the present invention.
Figure 16:
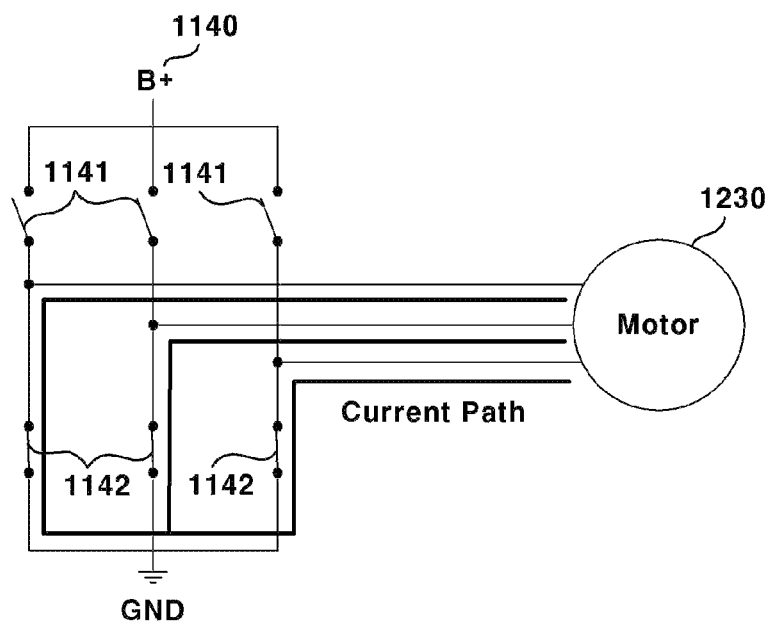

As described above, in order for the motor driving unit 1140 to operate in the motor braking mode, a short circuit must be formed in the upper switch or the lower switch of the motor driving unit 1140, the control unit 1130 may control the gate driver 1120 so that the motor driving unit 1140 operates as in FIG. 15 or 16. FIG. 15 shows an example in which a short circuit is formed in the upper switch of the motor driving unit 1140, wherein the upper switch 1141 is all on, and the lower switch 1142 are all off, and a current path to the motor 1230 is formed by the upper switches to form a short circuit, and through this, the motor 1230 may be braked. FIG. 16 shows an example in which a short circuit is formed in the lower switch of the motor driving unit 1140, wherein the upper switch 1141 is all off, the lower switch 1142 are all on, and a current path to the motor 1230 is formed by the lower switches to form a short circuit, and through this, the motor 1230 may be braked.

Figure 17:
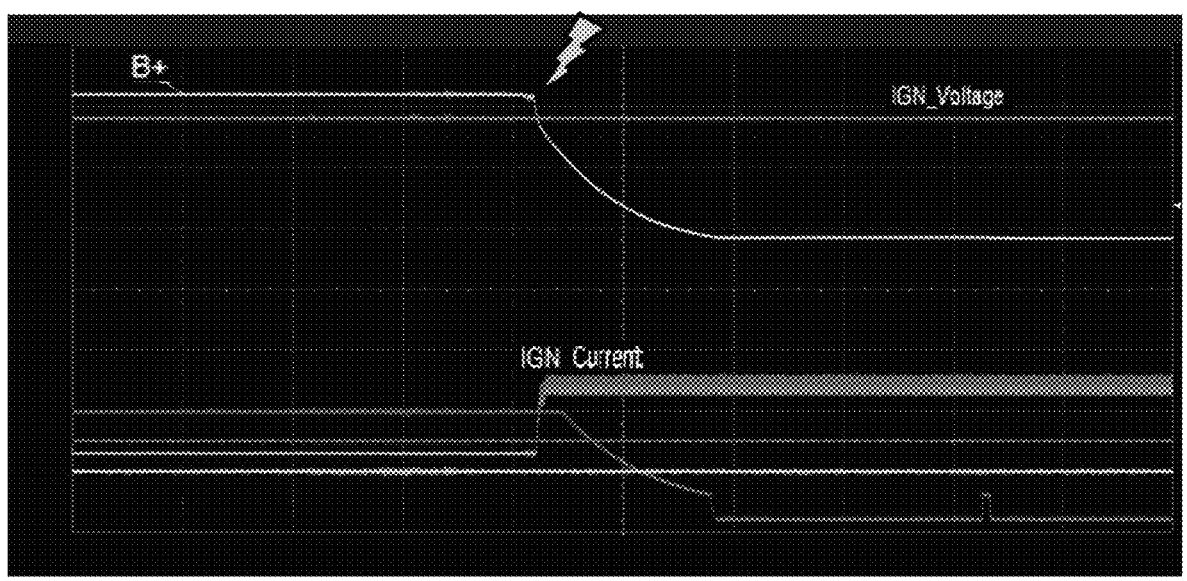

FIG. 17 is a waveform of a situation in which the supply of battery power is blocked, and is a waveform of supplying power using ignition power after B+ power is turned off. After the battery power is blocked, it can be seen that the ignition current increases and power is supplied.

Figure 18:
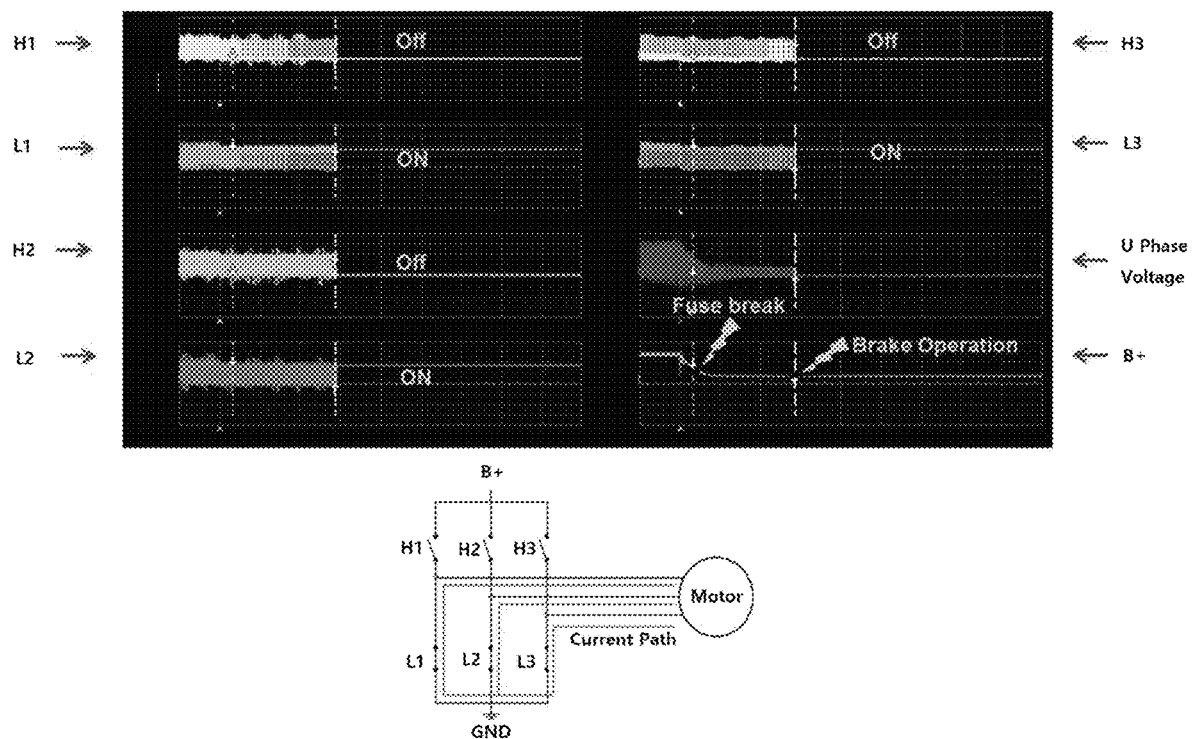

FIG. 18 shows the low side braking operation to form a short circuit in the lower switch in which when the battery power is blocked (Fuse brake), and about 6 ms later, the upper MOSFET switches H1, H2, and H3 are turned off and the lower MOSFET switches L1, L2, and L3 are turned on to form a short circuit in the lower switch so it can be seen that a braking operation is performed.

When the power supply from the battery power KL30 is stopped, the control unit (MCU) recognizes a failure situation after monitoring the battery power voltage through the battery power sensor and operates in a motor braking mode, and by floating the PWM signal being outputted to the gate driver to pull-up or pull-down the PWM signal, and by forming a short circuit in the motor driving unit (B6 bridge), and situations can be forwarded to vehicle systems or higher level controllers.

Figure 19:
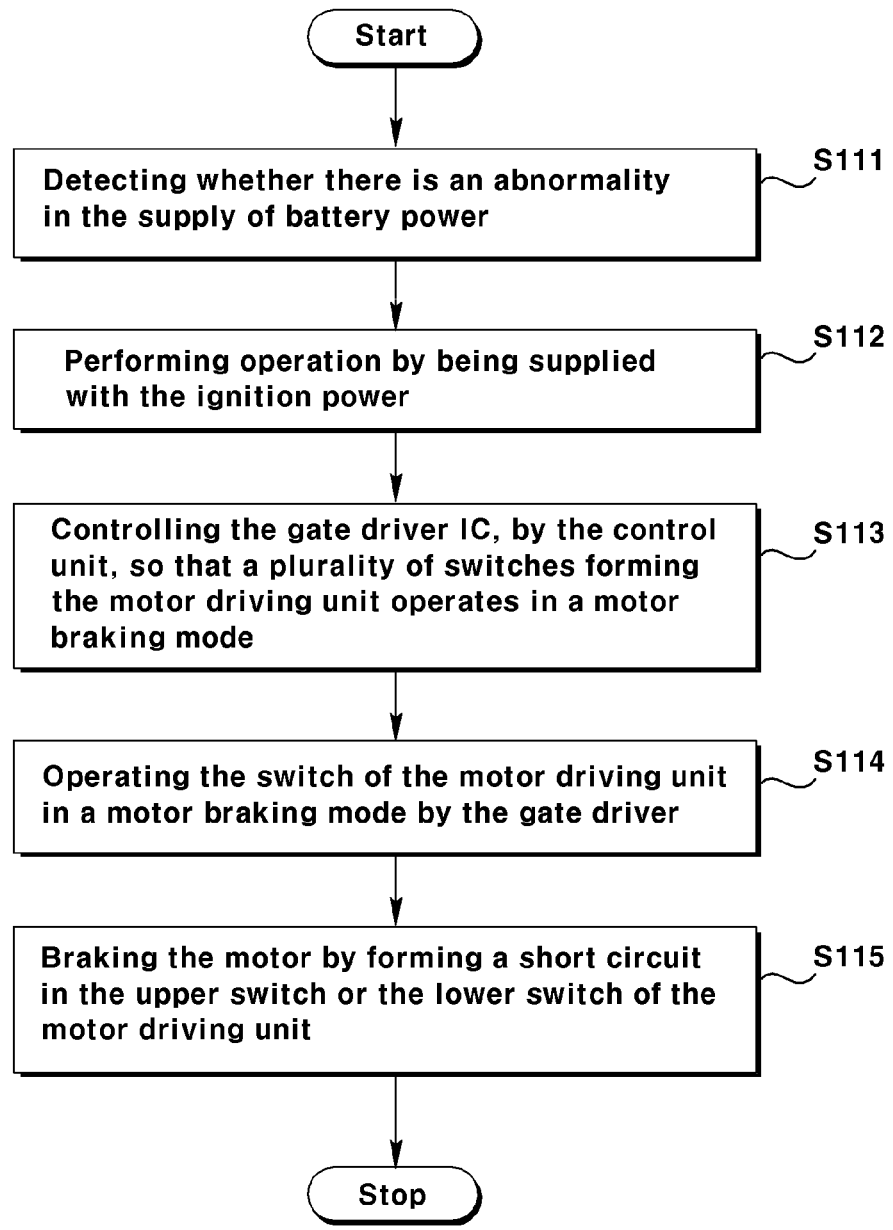
FIG. 19 is a flowchart of a motor emergency braking method according to an embodiment of a second embodiment of the present invention.
Figure 20:
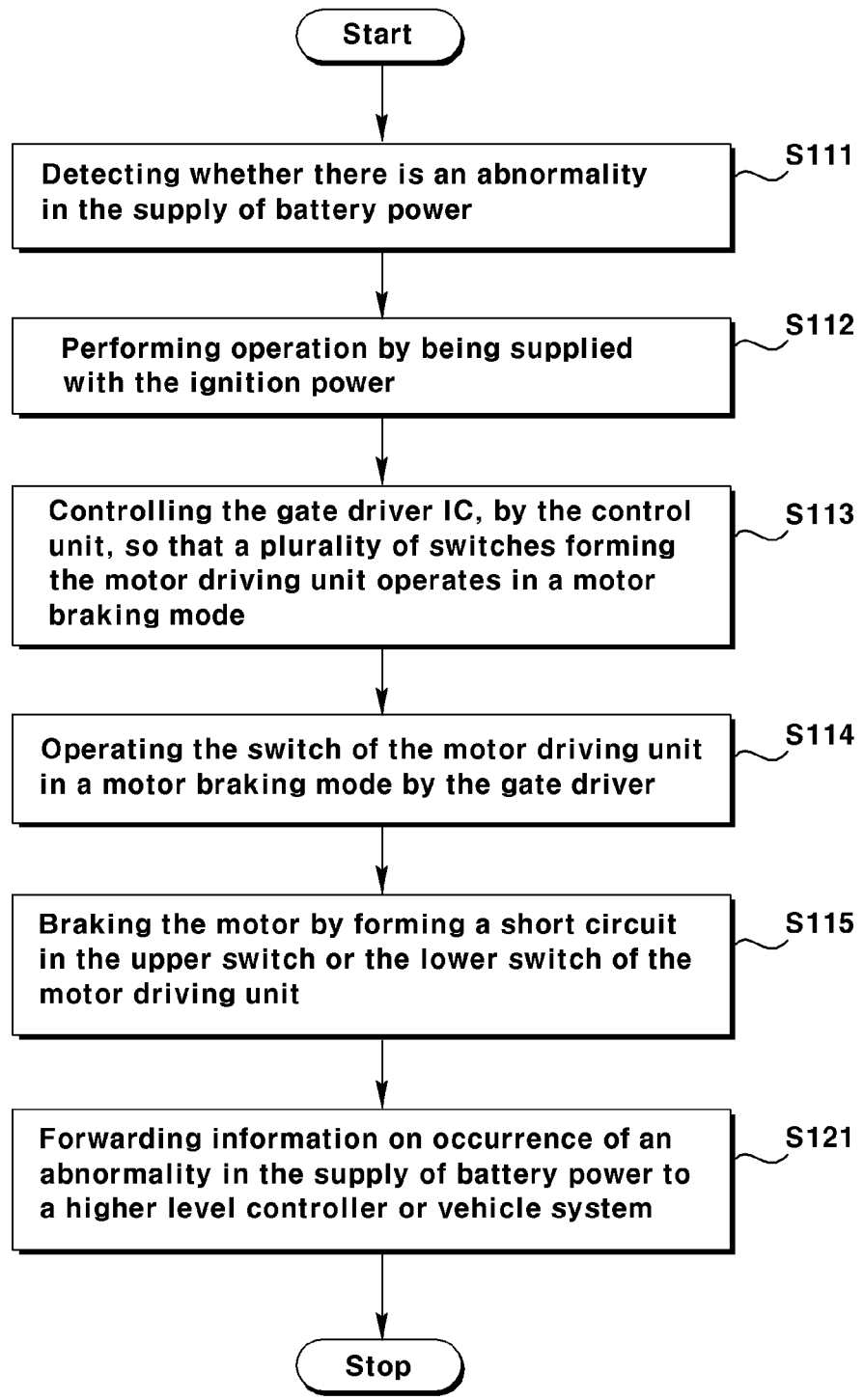
FIG. 20 is a flowchart of a motor emergency braking method according to another embodiment of a second embodiment of the present invention.

FIG. 19 is a flowchart of a motor emergency braking method according to an embodiment of a second embodiment of the present invention, and FIG. 20 is a flowchart of a motor emergency braking method according to another embodiment of a second embodiment of the present invention. The detailed description of each step of FIGS. 19 and 20 corresponds to the detailed description of the motor driving device of FIGS. 11 to 18, and thus the overlapping description will be omitted.

In step S111, it is detected whether there is an abnormality in the supply of battery power, and when an abnormality occurs in the supply of the battery power, in step S112, the ignition power is supplied and the operation is performed. In step S113, the control unit controls the gate driver so that a plurality of switches forming the motor driving unit operate in a motor braking mode, and in step S114, the gate driver operates the switch of the motor driving unit in a motor braking mode. At this time, it is possible to control the pulse width modulation signal being outputted from the gate driver. Through this, in step S115, a short circuit is formed in the upper switch or the lower switch of the motor driving unit to brake the motor.

When an abnormality occurs in the supply of battery power, a switch of the motor driving unit may be operated in a motor braking mode by pulling up the upper switch forming the motor driving unit to the first voltage and turning off the lower switch, or pulling down the lower switch to ground voltage and turning off the upper switch.

When the motor is stopped, in step S121, information on occurrence of an abnormality in the supply of battery power may be forwarded to a higher level controller or vehicle system.

A modified embodiment according to the present embodiment may include some configurations of the first embodiment and some configurations of the second embodiment together. That is, the modified embodiment may include the first embodiment, but some configurations of the first embodiment may be omitted and include some configurations of the corresponding second embodiment. Or, the modified embodiment may include the second embodiment, but some configurations of the second embodiment are omitted and include some configurations of the corresponding first embodiment.

Features, structures, effects, and the like described in the above embodiments are included in at least one embodiment, and are not necessarily limited to only one embodiment. Furthermore, features, structures, effects, and the like illustrated in each embodiment can be combined or modified for other embodiments by those of ordinary skill in the art to which the embodiments belong. Accordingly, the contents related to such combinations and variations should be interpreted as being included in the scope of the embodiments.

Meanwhile, the embodiments of the present invention can be implemented as computer-readable codes on a computer-readable recording medium. The computer-readable recording medium includes all types of recording devices in which data readable by a computer system is stored.

As examples of computer-readable recording media there are ROM, RAM, CD-ROM, magnetic tape, floppy disk, and optical data storage devices, and in addition, they are distributed across networked computer systems in a distributed manner in which computer-readable code can be stored and executed. And functional programs, codes, and code segments for implementing the present invention can be easily inferred by programmers in the technical field to which the present invention belongs.

As described above, in the present invention, specific matters such as specific components, and the like; and limited embodiments and drawings have been described, but these are only provided to help a more general understanding of the present invention, and the present invention is not limited to the above embodiments, and various modifications and variations are possible from these descriptions by those of ordinary skill in the art to which the present invention belongs.

Therefore, the spirit of the present invention should not be limited to the described embodiments, and not only the claims to be described later, but also all those with equivalent or equivalent modifications to the claims will be said to belong to the scope of the spirit of the present invention.

The invention claimed is:

1. A method for diagnosing failure of power input circuit comprising the steps of:
    measuring a first voltage at a rear stage of a power input unit, a second voltage at a rear stage of the power input circuit, and a first current flowing between a terminal measuring the first voltage and a terminal measuring the second voltage;
    deriving a voltage drop between the terminal measuring the first voltage and the terminal measuring the second voltage using the measured first current; and
    determining whether a failure occurs and a failure location by using the first voltage, the voltage drop, and the second voltage.

2. The method for diagnosing failure of power input circuit according to claim 1, comprising a step of:
    blocking the power input of the power input unit when it is determined that a failure has occurred.

3. The method for diagnosing failure of power input circuit according to claim 1, wherein the step of determining whether a failure occurs and a failure location comprises the steps of:
    determining whether the first voltage is normal;
    comparing the second voltage with a third voltage obtained by subtracting the voltage drop from the first voltage when the first voltage is normal; and
    determining whether a failure occurs and a failure location by using a difference between the third voltage and the second voltage.

4. The method for diagnosing failure of power input circuit according to claim 3, wherein when the first voltage is not normal, or when the difference between the third voltage and the second voltage is equal to or greater than a threshold value, it is determined that a failure has occurred.

5. The method for diagnosing failure of power input circuit according to claim 3, wherein when the first voltage is not normal, it is determined that a failure has occurred in the preceding stage of the terminal measuring the first voltage.

6. The method for diagnosing failure of power input circuit according to claim 5, wherein when the first voltage is normal and the difference between the third voltage and the second voltage is equal to or greater than a threshold value, it is determined that a failure has occurred in a circuit between the terminal measuring the first voltage and the terminal measuring the second voltage.

7. The method for diagnosing failure of power input circuit according to claim 1, wherein the step of measuring the first current is measuring the first current at a rear stage of the terminal measuring the second voltage.

8. The method for diagnosing failure of power input circuit according to claim 1, wherein the step of measuring the first current is measuring the first current at a MOSFET positioned between the terminal measuring the first voltage and the terminal measuring the second voltage.

9. The method for diagnosing failure of power input circuit according to claim 1, wherein at the step of deriving the voltage drop, the voltage drop is derived from a lookup table in which relationship between the first current and the voltage drop according to the first current is stored.

10. In a system for diagnosing a failure of a power input circuit comprising a power input unit, the system for diagnosing a failure of a power input circuit comprises:
    a first voltage measurement unit measuring a first voltage of a rear stage of the power input unit;
    a second voltage measurement unit configured to measure a second voltage of the rear stage of the power input circuit;
    a first current measurement unit configured to measure a first current flowing between a terminal measuring the first voltage and a terminal measuring the second voltage; and
    a processing unit configured to derive a voltage drop between the terminal measuring the first voltage and the terminal measuring the second voltage using the first current being measured, and determining whether or not a failure occurs and a failure location using the first voltage, the voltage drop, and the second voltage.

11. The system for diagnosing a failure of a power input circuit according to claim 10, wherein the processing unit blocks power input of the power input unit when it is determined that a failure has occurred.

12. The system for diagnosing a failure of a power input circuit according to claim 10, wherein the processing unit determines whether the first voltage is normal, compares the second voltage with a third voltage obtained by subtracting the voltage drop from the first voltage when the first voltage is normal, and determines whether a failure occurs and a location of the failure by using a difference between the third voltage and the second voltage.

13. The system for diagnosing a failure of a power input circuit according to claim 12, wherein the processing unit determine that failure has occurred when the first voltage is not normal or when the difference between the third voltage and the second voltage is equal to or greater than a threshold value.

14. The system for diagnosing a failure of a power input circuit according to claim 12, wherein when the first voltage is not normal, the processing unit determines that a failure has occurred in the preceding stage of the terminal measuring the first voltage.

15. The system for diagnosing a failure of a power input circuit according to claim 12, wherein when the first voltage is normal and the difference between the third voltage and the second voltage is equal to or greater than a threshold value, the processing unit determines that a failure has occurred in a circuit between the terminal measuring the first voltage and the terminal measuring the second voltage.

16. The system for diagnosing a failure of a power input circuit according to claim 10, wherein the first current measurement unit measures the first current at a rear stage of the power input circuit.

17. The system for diagnosing a failure of a power input circuit according claim 10, wherein the power input circuit comprises a reverse connection preventing unit.

18. The system for diagnosing a failure of a power input circuit according to claim 17, wherein the first current measurement unit measures the first current in the reverse connection preventing unit.

19. The system for diagnosing a failure of a power input circuit according to claim 10, comprising:
- a MOSFET positioned between the terminal measuring the first voltage and the terminal measuring the second voltage,
- wherein the first current measurement unit measures the first current in the MOSFET.

20. The system for diagnosing a failure of a power input circuit according to claim 10, comprising:
- a storage unit configured to store a lookup table storing a relationship between the first current and voltage drop according to the first current.

* * * * *